(12) United States Patent
Hamatani et al.

(10) Patent No.: US 11,539,342 B2
(45) Date of Patent: Dec. 27, 2022

(54) ACOUSTIC WAVE DEVICE AND COMMUNICATION APPARATUS

(71) Applicant: KYOCERA Corporation, Kyoto (JP)

(72) Inventors: Kazuyuki Hamatani, Kyoto (JP); Hiroyuki Tanaka, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 1006 days.

(21) Appl. No.: 16/320,244

(22) PCT Filed: Jul. 24, 2017

(86) PCT No.: PCT/JP2017/026698
§ 371 (c)(1),
(2) Date: Jan. 24, 2019

(87) PCT Pub. No.: WO2018/021242
PCT Pub. Date: Feb. 1, 2018

(65) Prior Publication Data
US 2019/0267968 A1    Aug. 29, 2019

(30) Foreign Application Priority Data

Jul. 26, 2016    (JP) .............................. JP2016-146347

(51) Int. Cl.
*H03H 9/02* (2006.01)
*H03H 9/05* (2006.01)
(Continued)

(52) U.S. Cl.
CPC .... *H03H 9/02874* (2013.01); *H03H 9/02559* (2013.01); *H03H 9/02637* (2013.01);
(Continued)

(58) Field of Classification Search
CPC ........... H03H 9/02874; H03H 9/02559; H03H 9/02637; H03H 9/02834; H03H 9/02897;
(Continued)

(56) References Cited

U.S. PATENT DOCUMENTS 6,351,195 B1    2/2002   Atokawa et al.
7,463,115 B2 *  12/2008  Okuyama ............... H01L 23/50
                                                    257/E23.079
(Continued)

FOREIGN PATENT DOCUMENTS

JP    2000-244207 A    9/2000
JP    2007-142560 A    6/2007
(Continued)

*Primary Examiner* — Eugene Yun
(74) *Attorney, Agent, or Firm* — Procopio Cory Hargreaves and Savitch LLP

(57) ABSTRACT

The multiplexer includes a plurality of IDT electrodes on a substrate, an insulating cover located on the substrate so as to configure one or more spaces above the plurality of IDT electrodes, an antenna terminal, transmission terminal, and reception terminal which are all located on the substrate and pass through the cover, and a reinforcing layer which is located on the cover and is made of metal. By the plurality of IDT electrodes, a transmission filter located in a signal path connecting the antenna terminal and the transmission terminal and a receiving filter located in a signal path connecting the antenna terminal and the reception terminal. The reinforcing layer includes a first area part facing the transmission filter and a second area part which faces the receiving filter and is separated from the first area part.

8 Claims, 16 Drawing Sheets

(51) Int. Cl.
*H03H 9/10* (2006.01)
*H03H 9/145* (2006.01)
*H03H 9/25* (2006.01)
*H03H 9/64* (2006.01)
*H03H 9/72* (2006.01)
*H04B 11/00* (2006.01)

(52) U.S. Cl.
CPC .... *H03H 9/02834* (2013.01); *H03H 9/02897* (2013.01); *H03H 9/02937* (2013.01); *H03H 9/059* (2013.01); *H03H 9/1071* (2013.01); *H03H 9/145* (2013.01); *H03H 9/25* (2013.01); *H03H 9/6483* (2013.01); *H03H 9/72* (2013.01); *H03H 9/725* (2013.01); *H04B 11/00* (2013.01)

(58) Field of Classification Search
CPC .. H03H 9/02937; H03H 9/059; H03H 9/1071; H03H 9/145; H03H 9/25; H03H 9/6483; H03H 9/72; H03H 9/725; H04B 11/00
See application file for complete search history.

(56) References Cited

U.S. PATENT DOCUMENTS

| | | | |
|---|---|---|---|
| 2007/0111674 | A1 | 5/2007 | Iwamoto et al. |
| 2009/0071711 | A1 | 3/2009 | Takano et al. |
| 2012/0086309 | A1* | 4/2012 | Yamaji ................ H03H 9/1092 310/313 B |
| 2012/0313724 | A1 | 12/2012 | Tsurunari et al. |
| 2014/0232239 | A1 | 8/2014 | Iwasaki et al. |
| 2016/0294359 | A1* | 10/2016 | You ..................... H03H 9/02818 |
| 2019/0068155 | A1* | 2/2019 | Kimura .............. H03H 9/02228 |

FOREIGN PATENT DOCUMENTS

| | | |
|---|---|---|
| JP | 2007-195145 A | 8/2007 |
| JP | 2008-227748 A | 9/2008 |
| JP | 2009-225198 A | 10/2009 |
| JP | 2012-119928 A | 6/2012 |
| JP | 2014-175885 A | 9/2014 |
| WO | 2011/061904 A1 | 5/2011 |

* cited by examiner

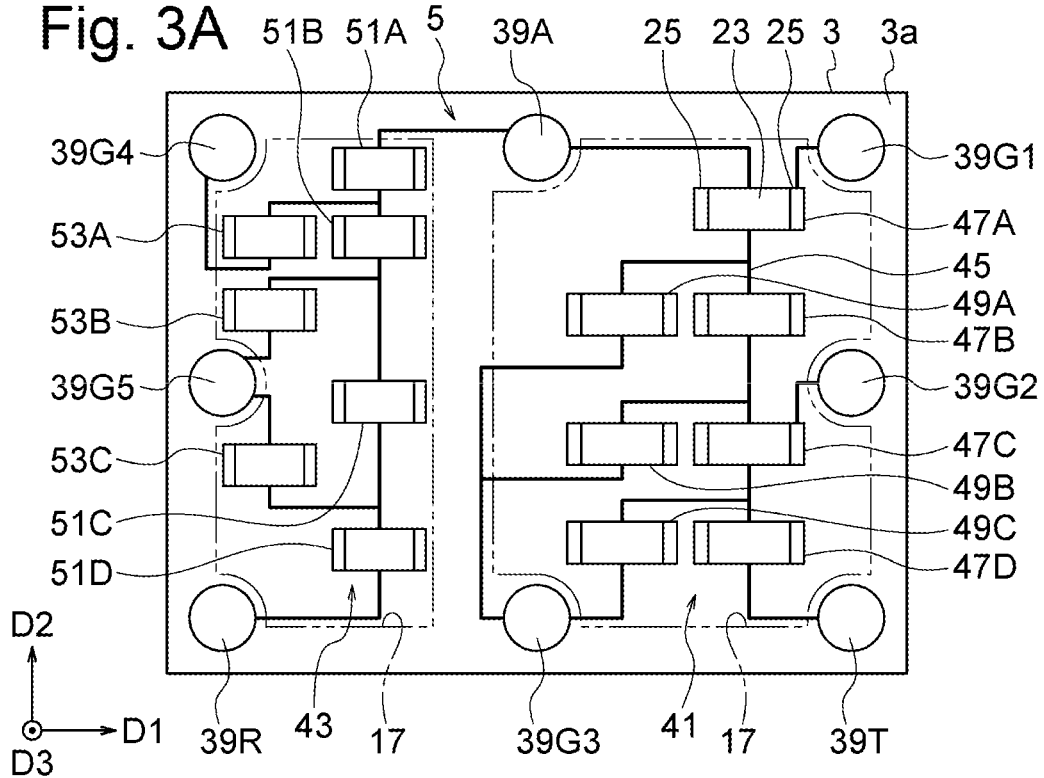
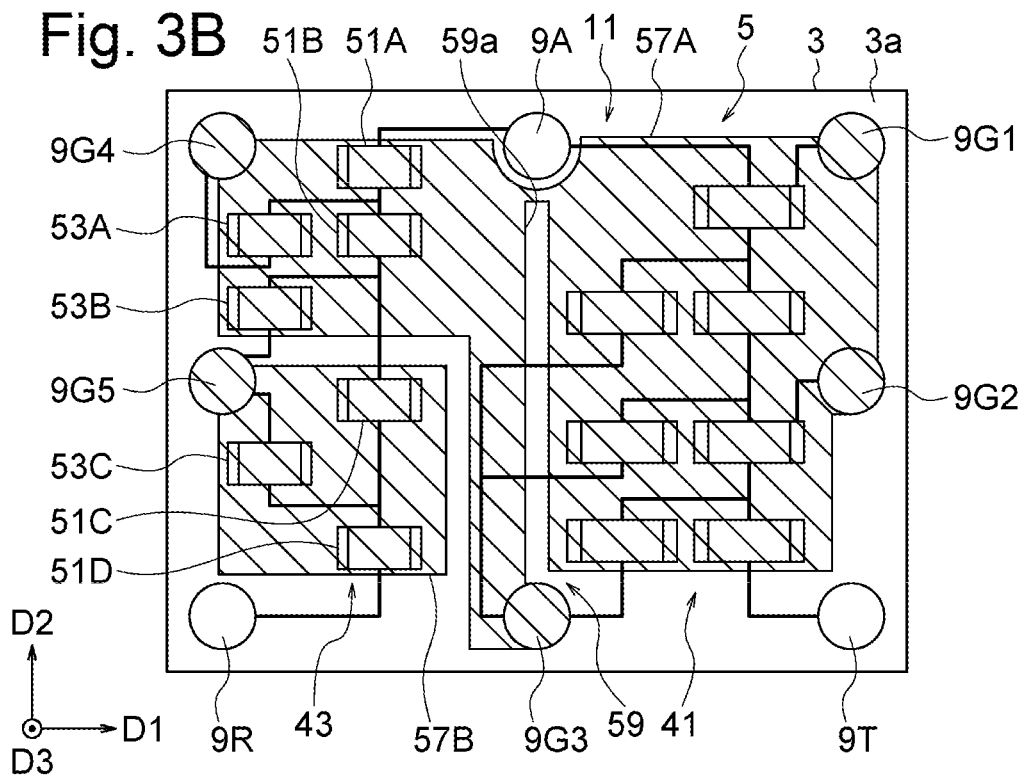

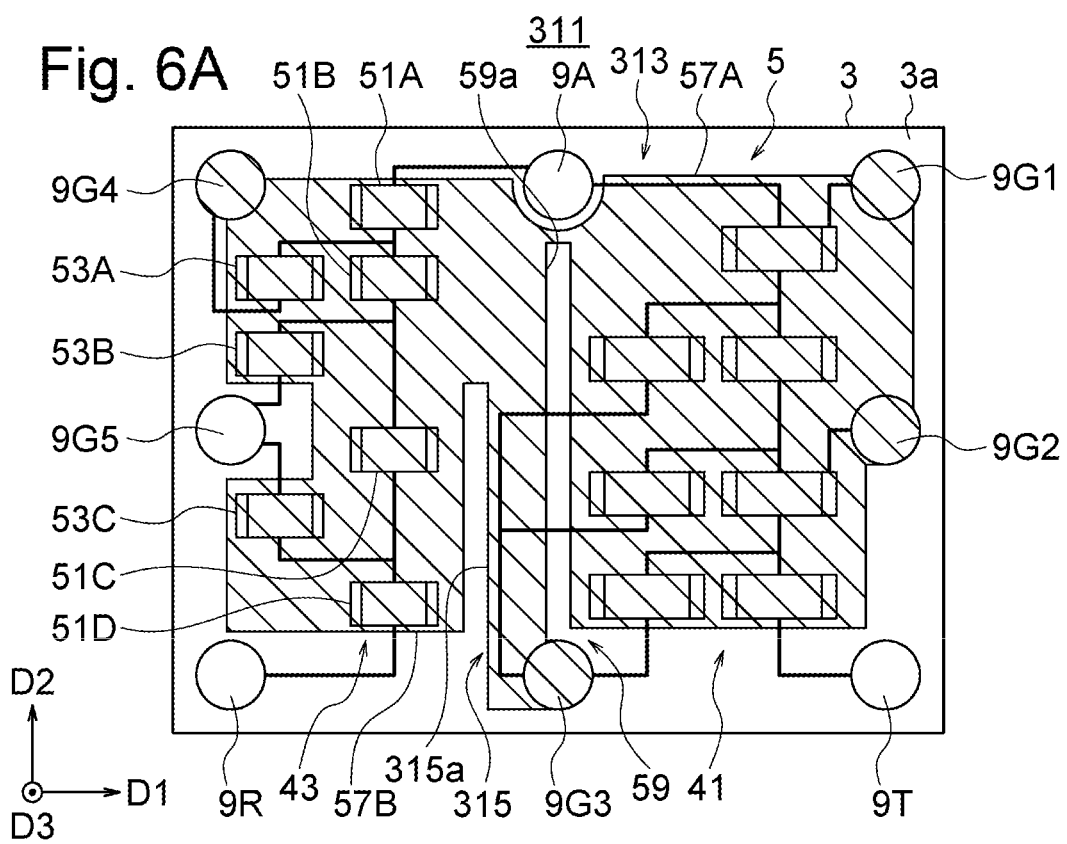
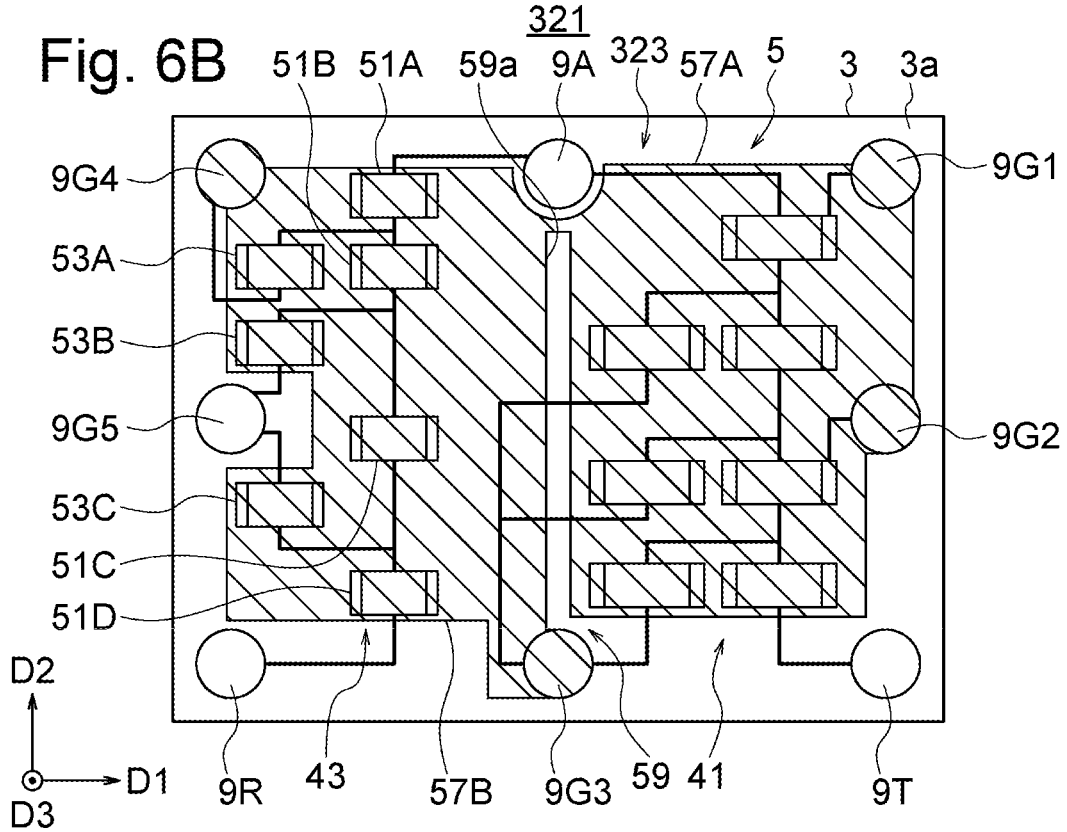

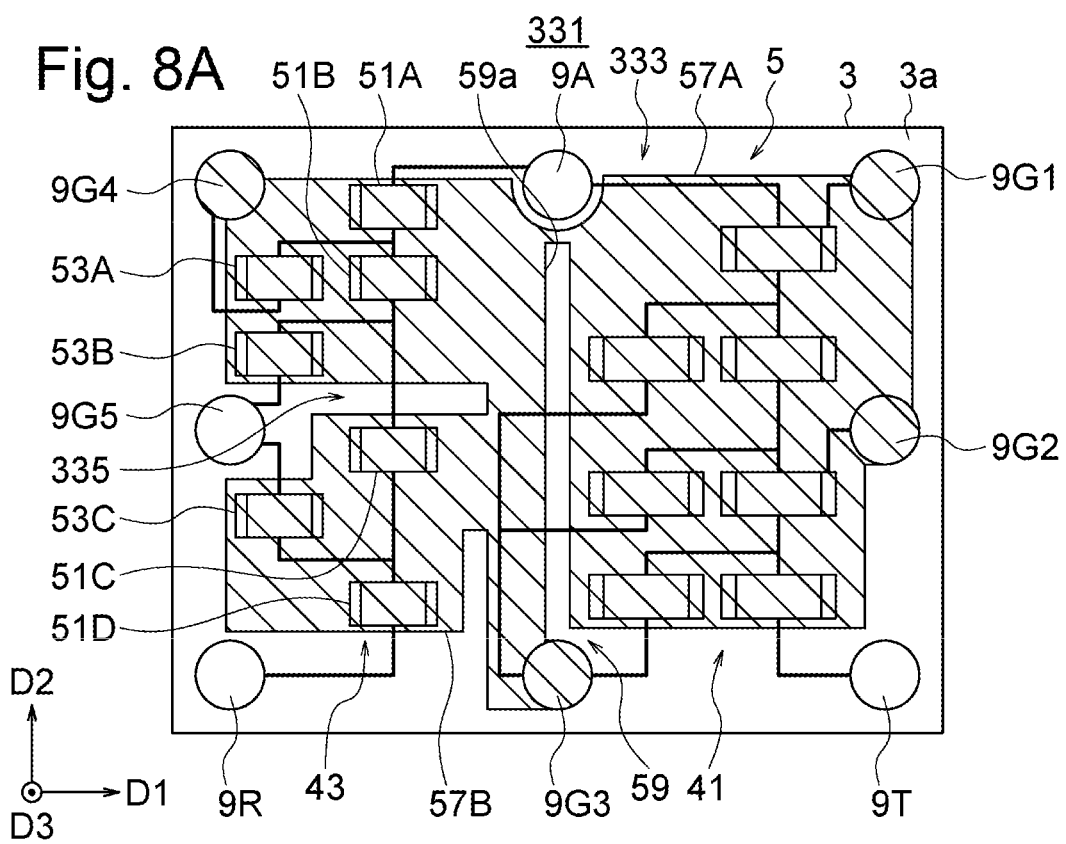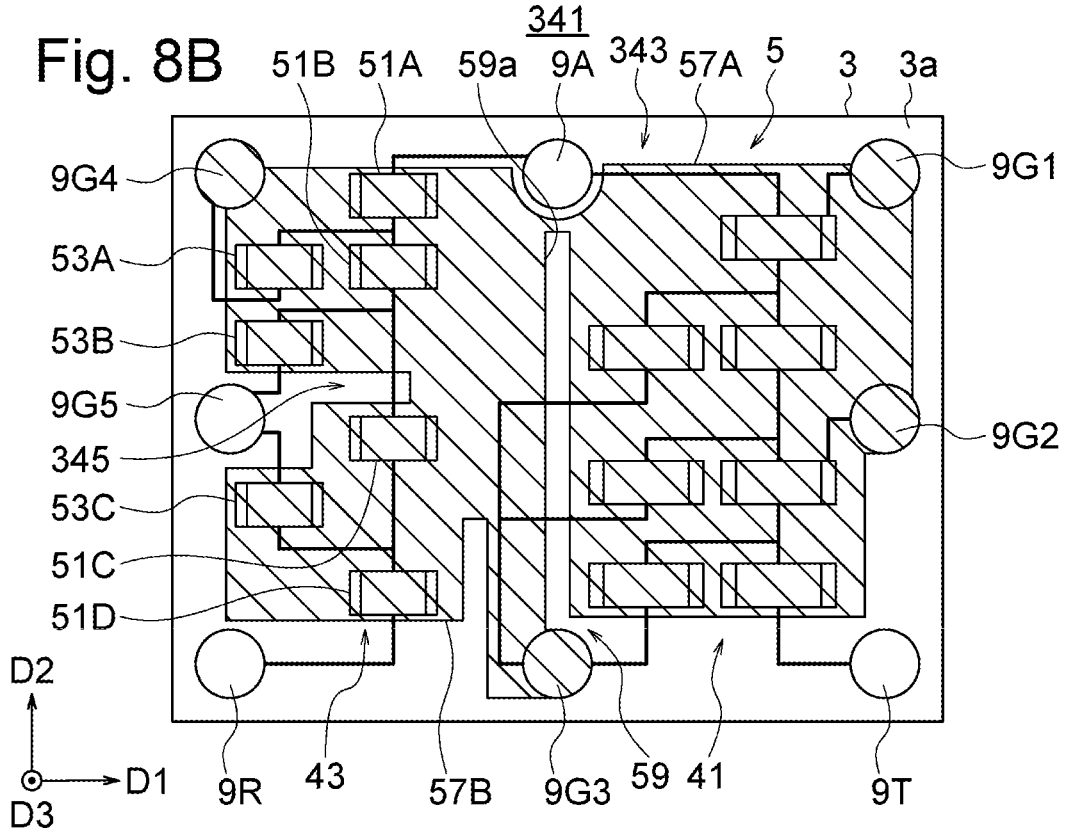

ACOUSTIC WAVE DEVICE AND COMMUNICATION APPARATUS

TECHNICAL FIELD

The present disclosure relates to an acoustic wave device and a communication apparatus which filter signals by utilizing an acoustic wave. The acoustic wave is for example a surface acoustic wave (SAW).

BACKGROUND ART

An acoustic wave device has for example a piezoelectric substrate, electrodes which are provided on one surface of the piezoelectric substrate and excite the acoustic wave, and a cover covering the surface of the piezoelectric substrate from the tops of the electrodes. The cover is formed so as to configure a space above the electrodes in order to facilitate vibration (propagation of the acoustic wave) on the piezoelectric substrate. It is known in the art to form a reinforcing layer made of metal on an upper surface or in an internal portion of the cover in order to suppress flexural deformation of this cover to the space side (for example, Patent Literature 1).

In Patent Literature 1, the reinforcing layer is formed so as to become smaller than the space in a transparent projection view of the surface of the piezoelectric substrate. Further, in Patent Literature 1, two spaces are formed between the piezoelectric substrate and the cover, and the reinforcing layer is formed for each space. In Patent Literature 1, preferably the reinforcing layer is surrounded by the resin configuring the cover and is separated from the electrodes. Patent Literature 1 refers to generation of a stray capacitance by the reinforcing layer.

CITATION LIST

Patent Literature

Patent Literature 1: Japanese Patent Publication No. 2008-227748

SUMMARY OF INVENTION

An acoustic wave device according to one aspect of the present disclosure includes a piezoelectric substrate, a plurality of electrodes, a cover, a common terminal, a first terminal and second terminal, and a reinforcing layer. The piezoelectric substrate includes a first surface. The plurality of electrodes are located on the first surface and excite acoustic waves. The cover is located on the first surface so as to configure one or more spaces above the plurality of electrodes. The cover is insulating. The common terminal, the first terminal, and the second terminal are located on the first surface and pass through the cover. The reinforcing layer is located on the cover, is made of metal, and is connected to a reference potential. Further, by the plurality of electrodes, a first filter located in a first signal path connecting the common terminal and the first terminal and a second filter located in a second signal path connecting the common terminal and the second terminal are configured. The reinforcing layer includes a first area part which faces the first filter and the second filter and a second area part which faces the second filter and is separated from the first area part.

A communication apparatus according to one aspect of the present disclosure includes an antenna, an acoustic wave device described above including the common terminal connected to the antenna, and an integrated circuit element connected to the first terminal and to the second terminal.

BRIEF DESCRIPTION OF DRAWINGS

FIG. 3A is a plan view showing the configuration of a main body of the multiplexer in FIG. 1, and FIG. 3B is a planar transparent projection view for explaining the planar shape of a reinforcing layer in the multiplexer in FIG. 1.

FIG. 6A is a transparent projection view showing the configuration of a multiplexer according to a second comparative example, and FIG. 6B is a transparent projection view showing the configuration of a multiplexer according to a third comparative example.

FIG. 8A is a transparent projection view showing the configuration of a multiplexer according to a fourth comparative example, and FIG. 8B is a transparent projection view showing the configuration of a multiplexer according to a fifth comparative example.

DESCRIPTION OF EMBODIMENTS

Figure 1A:
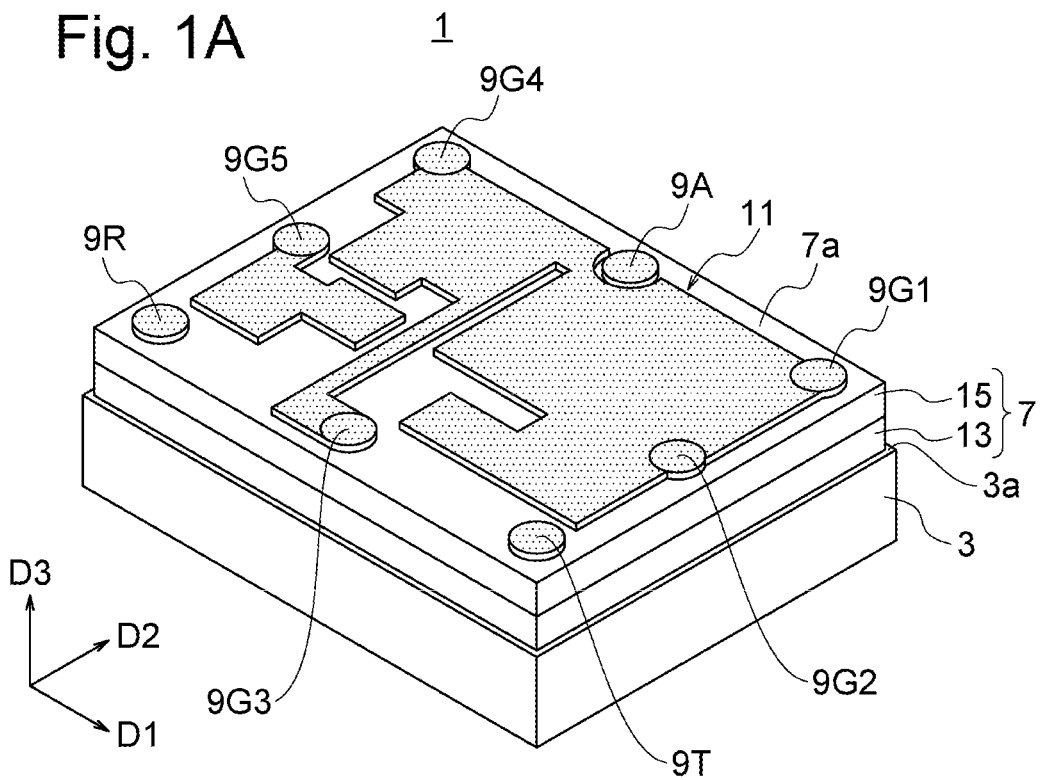
FIG. 1A is a perspective view of an outer appearance showing a multiplexer according to a first embodiment.

Below, embodiments according to the present disclosure will be explained with reference to the drawings. Note that, the drawings used in the following explanation are schematic ones. Size ratios and so on in the drawings do not always coincide with the actual ones.

The same or similar configurations will be sometimes referred to by attaching mutually different numbers and letters with respect to the same terms such as "first serial resonator 47A" and "second serial resonator 47B". Further, in this case, sometimes they will be simply referred to as the "serial resonators 47" and will not be differentiated.

In the second and following embodiments, for the configurations which are common with or similar to the configurations in the already explained embodiments, sometimes use will be made of the notations attached to the configurations in the already explained embodiments. Further, sometimes illustrations and explanations will be omitted. Note that, the configurations corresponding to (resembling) the configurations in the already explained embodiments are the same as the configurations in the already explained embodiments unless particularly explained even in a case where notations different from those of the configurations in the already explained embodiments are attached.

In the SAW device according to the present disclosure, any direction may be defined as the "above" or "below". In the following description, however, for convenience, an orthogonal coordinate system comprised of a D1 axis, D2 axis, and D3 axis will be defined, and sometimes use will be made of the "upper surface", "lower surface", and other terms where the positive side of the D3 axis is the upper part. Further, when referring to "viewed on a plane" or "in a transparent projection view", unless it is particularly explained, it means "viewed in the D3 axis direction". Note that, the D1 axis is defined so as to become parallel to a direction of propagation of the SAW propagating along the upper surface of the piezoelectric substrate which will be explained later, the D2 axis is defined so as to be parallel to the upper surface of the piezoelectric substrate and perpendicular to the D1 axis, and the D3 axis is defined so as to be perpendicular to the upper surface of the piezoelectric substrate.

EMBODIMENTS (Overall Configuration of Multiplexer)

Figure 1B:
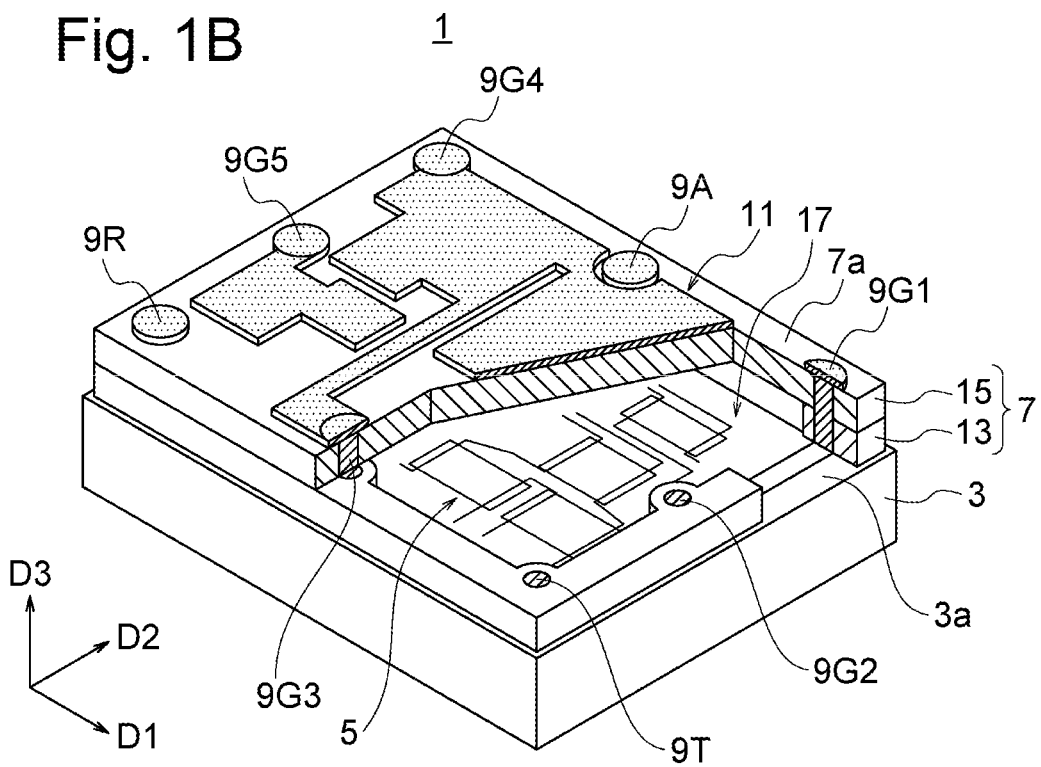
FIG. 1B is a perspective view showing the multiplexer in FIG. 1A with a part cut away.

FIG. 1A is a perspective view of the outer appearance showing a multiplexer 1 as an example of a SAW device according to the embodiments. FIG. 1B is a perspective view showing the multiplexer 1 with a part cut away.

The multiplexer 1 is configured by a so-called wafer level package (WLP) type SAW device. The multiplexer 1 is for example a substantially thin rectangular cuboid shaped part. The dimensions thereof may be suitably set. For example, the length of one side (D1 axis direction or D2 axis direction) when viewed on a plane is 0.5 mm to 2 mm, and the thickness (D3 axis direction) is 0.2 mm to 0.6 mm.

At the upper surface of the multiplexer 1, a plurality of (eight in the example shown) terminals (9A, 9T, 9R, and 9G1 to 9G5, below, sometimes referred to as the "terminals 9") are exposed. The antenna terminal 9A is a terminal connected with a not shown antenna. The transmission terminal 9T is a terminal for inputting a transmission signal to be output from the antenna terminal 9A to the antenna to the multiplexer 1. The reception terminal 9R is a terminal for outputting the reception signal which was input from the antenna to the antenna terminal 9A from the multiplexer 1. The first GND terminal 9G1 to the fifth GND terminal 9G5 (below, sometimes simply referred to as the "GND terminals 9G") are terminals given the reference potential. Note that, the reference potential is the potential becoming the reference, but it is not limited to 0V.

The multiplexer 1 is mounted on a not shown circuit board by arranging it so that its upper surface is made to face the circuit board and having the pads on the circuit board and the terminals 9 bonded by solder or other bumps. After that, by a transfer mold or the like, a not shown mold resin is placed on the periphery of the multiplexer 1 whereby the multiplexer 1 is sealed by the resin. The mold resin is also filled in a clearance formed between the circuit board and the multiplexer 1 to the thickness of the bumps.

The multiplexer 1 has for example a substrate 3, a multiplexer body 5 provided on an upper surface 3a of the substrate 3 (FIG. 1B), a cover 7 covering the multiplexer body 5, the plurality of terminals 9 explained above which are exposed from an upper surface 7a of the cover 7, and a reinforcing layer 11 superimposed on the upper surface 7a of the cover 7.

The substrate 3 is for example configured by a single crystal having a piezoelectric characteristic. The single crystal is for example a lithium niobate ($LiNbO_3$) single crystal or lithium tantalate ($LiTaO_3$) single crystal. The cut angle may be suitably set in accordance with the type etc. of the SAW utilized. For example, the substrate 3 is a rotated Y-cut and X-propagated one. That is, the X-axis is parallel to the upper surface (D1 axis) of the substrate 3, while the Y-axis is inclined by a predetermined angle relative to the normal line of the upper surface of the substrate 3. The planar shape of the substrate 3 is for example rectangular. The size of the substrate 3 may be suitably set. For example, the length of one side (D1 axis direction or D2 axis direction) when viewed on a plane is 0.3 mm to 2 mm, and the thickness (D3 axis direction) is 0.2 mm to 0.5 mm. The substrate 3 may be one which is formed relatively thin and to which a support substrate made of an inorganic material or organic material is adhered at the back surface (surface on the negative side of the D3 axis) as well.

The multiplexer body 5 is configured by provision of a conductive layer or the like on the upper surface 3a of the substrate 3. The multiplexer body 5 is the part responsible for most of the function of separating the plurality of signal paths connected to the antenna.

In the cover 7, for example, the outer side is substantially rectangular cuboid shaped. The upper surface 7a of the cover 7 is for example substantially parallel relative to the upper surface 3a of the substrate 3. Further, it has a substantially equal broadness as the upper surface 3a of the substrate 3. The cover 7 has a frame 13 of a frame shape in a plan view and has a lid 15 closing the opening of the frame 13. Due to this, above the upper surface 3a of the substrate 3, a space 17 (FIG. 1B) for facilitating vibration of the upper surface 3a is configured.

The frame 13 is for example configured by formation of one or more openings which become spaces 17 in a layer having a substantially constant thickness. The thickness of the frame 13 (height of the space 17) is for example a few micrometers to 30 micrometers. The lid 15 is for example configured by a layer having a substantially constant thickness laid on the frame 13. The thickness of the lid 15 is for example a few micrometers to 30 micrometers.

The frame 13 and the lid 15 may be formed by the same material or may be formed by materials different from each other. FIG. 1A and FIG. 1B clearly show a boundary line of the frame 13 and the lid 15 for convenience of explanation. However, in an actual product, the frame 13 and the lid 15 may be integrally formed by the same material as well.

The cover 7 (frame 13 and lid 15) is basically configured by an insulation material. The insulation material is for example a photosensitive resin. The photosensitive resin is for example a urethane acrylate, polyester acrylate, or epoxy acrylate resin which is hardened by radical polymerization of the acryl groups, methacryl groups, etc. Note that, a conductor may be arranged in a portion of the cover 7 as well.

The terminals 9 are formed in columnar shapes standing on the upper surface 3a of the substrate 3 like the first GND terminal 9G1 with the cross-section shown in FIG. 1B. They pass through the frame 13 and the lid 15 toward the direction that the upper surface 3a faces and are exposed at the upper surface of the cover 7. The terminals 9 may have flange shaped portions which project out from the side surfaces on the upper end sides of the columnar portions and are superimposed on the upper surface of the cover 7 (example shown) or may not have them.

The number and arrangement of the plurality of terminals 9 may be suitably set. In the example shown, the plurality of terminals 9 are arranged along an outer circumferential edge of the cover 7 (substrate 3) which is rectangularly shaped when viewed on a plane. More specifically, for example the antenna terminal 9A is adjacent to a first side of the rectangle so as to be positioned at the center of the first side. The transmission terminal 9T is for example adjacent to a second side opposite to the first side so as to be positioned on one end side of the second side. The reception terminal 9R is positioned on the other end side of the second side. Note that, "adjacent to the first side (or second side)" means that, for example, when dividing the side perpendicular to the first side into equal three parts, the center position of the terminal 9 is positioned in a range on the first side. Further, "positioned at the center (or on the end part side) of the first side" means that, for example, when dividing the first side into equal three parts, the center position of the terminal 9 is positioned in a range of the center (or the end).

The reinforcing layer 11 is one for reinforcing the strength of the cover 7 (particularly the lid 15). The material of the reinforcing layer 11 is a material having a higher Young's modulus than the material of the cover 7 and is for example a metal. The metal is for example Cu, it may be the same material as that for the terminals 9 (majority thereof) as well. At least a portion of the reinforcing layer 11 overlaps the space 17 in a transparent projection view. In a transparent projection view, the entirety of the reinforcing layer 11 may fall into the space 17 or at least a portion may be positioned outside of the space 17.

(Fundamental Configuration of SAW Resonator)

Figure 2:
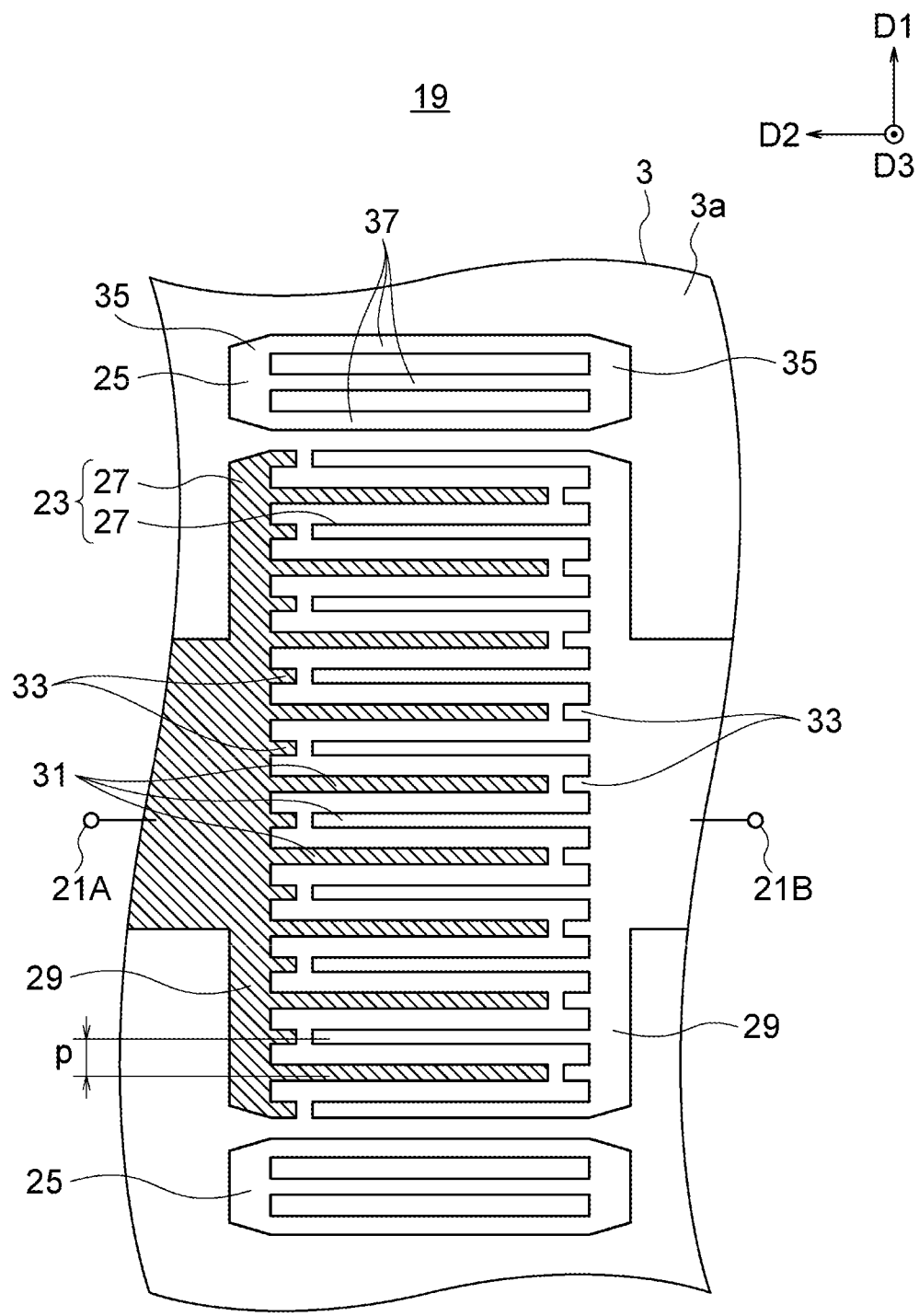
FIG. 2 is a plan view showing the configuration of a SAW resonator.

FIG. 2 is a plan view showing the configuration of a SAW resonator 19 which forms a fundamental component of the multiplexer body 5.

The SAW resonator 19 is a so-called one-port SAW resonator. The SAW resonator 19, for example, resonates when receiving as input an electrical signal of a predetermined frequency from one of a first pad 21A and second pad 21B which are schematically shown and outputs a resonating signal from the other of the first pad 21A and second pad 21B.

The SAW resonator 19 includes for example the substrate 3 explained above, an IDT (interdigital transducer) electrode 23 provided on the upper surface 3a of the substrate 3, and a pair of reflectors 25 positioned on the two sides of the IDT electrode 23.

The IDT electrode 23 and the reflectors 25 are configured by a layer-shaped conductor provided on the substrate 3. The IDT electrode 23 and the reflectors 25 are for example configured by materials the same as each other to mutually same thicknesses. The layer-shaped conductor configuring them is for example a metal. The metal is for example Al or an alloy containing Al as the principal ingredient (Al alloy). The Al alloy is for example an Al—Cu alloy. The layer-shaped conductor may be configured by a plurality of metal layers as well. The thickness of the layer-shaped conductor is suitably set in accordance with the electrical characteristics etc. demanded from the SAW resonator 19. As an example, the thickness of the layer-shaped conductor is 50 nm to 400 nm.

The IDT electrode 23 includes a pair of comb-shaped electrodes 27. Each comb-shaped electrode 27 includes a bus bar 29, a plurality of electrode fingers 31 extending from the bus bar 29 alongside each other, and dummy electrodes 33 each projecting from the bus bar 29 between two or more electrode fingers 31. The pair of comb-shaped electrodes 27 are arranged so that their pluralities of electrode fingers 31 intermesh (intersect) with each other.

The bus bars 29 are for example formed in substantially long shapes linearly extending in the direction of propagation of the SAW (D1 axis direction) with constant widths. Further, the pair of bus bars 29 face each other in the direction (D2 axis direction) perpendicular to the direction of propagation of the SAW. Note that, the bus bars 29 may change in the widths or be inclined relative to the direction of propagation of the SAW.

Each electrode finger 31 is for example formed in substantially a long shape linearly extending in the direction (D2 axis direction) perpendicular to the direction of propagation of the SAW with a constant width. In each comb-shaped electrode 27, the plurality of electrode fingers 31 are aligned in the direction of propagation of the SAW. Further, the plurality of electrode fingers 31 in one comb-shaped electrode 27 and the plurality of electrode fingers 31 in the other comb-shaped electrode 27 are basically alternately aligned.

A pitch "p" of the plurality of electrode fingers 31 (for example a distance between the centers of two electrode fingers 31 neighboring each other) is basically constant in the IDT electrodes 23. Note that, in a portion of the IDT electrodes 23, a narrow pitch portion becoming narrower in the pitch "p" than the major parts other than the portion or a broad pitch portion becoming broader in the pitch "p" than the major parts other than the portion may be provided as well.

The number of the electrode fingers 31 may be suitably set in accordance with the electrical characteristics etc. demanded from the SAW resonator 19. Note that, FIG. 2 is a schematic view, therefore a smaller number of electrode fingers 31 are shown. In actuality, a larger number of electrode fingers 31 than the ones shown may be arranged. This is true also for the strip electrodes 37 in the reflectors 25 which will be explained later.

The lengths of the plurality of electrode fingers 31 are for example equivalent to each other. Note that, the IDT electrode 23 may be "apodized" so that the length (from another viewpoint, intersecting widths) of the plurality of electrode fingers 31 change in accordance with the positions in the propagation direction. The lengths and widths of the electrode fingers 31 may be suitably set corresponding to the electrical characteristics etc. which are demanded.

The dummy electrodes 33 for example substantially project out in the direction perpendicular to the direction of propagation of the SAW with constant widths. The widths thereof are for example equivalent to the widths of the electrode fingers 31. Further, the plurality of dummy electrodes 33 are aligned with an equivalent pitch to that of the plurality of electrode fingers 31. The front ends of the dummy electrodes 33 in one comb-shaped electrode 27 face the front ends of the electrode fingers 31 in the other comb-shaped electrode 27 across a gap. Note that, the IDT electrode 23 need not include dummy electrodes 33 either.

A pair of reflectors 25 are positioned on the two sides of the IDT electrode 23 in the direction of propagation of the SAW. Each reflector 25 may be for example made an electrically floating state or may be given the reference potential. Each reflector 25 is for example formed in a lattice shape. That is, the reflector 25 includes a pair of bus bars 35 facing each other and a plurality of strip electrodes 37 extending between the pair of bus bars 35.

The shapes of the bus bars 35 and strip electrodes 37 may be made the same as those of the bus bars 29 and electrode fingers 31 in the IDT electrode 23 except that the two ends of the strip electrodes 37 are connected to the pair of bus bars 35. For example, the bus bars 35 are formed in substantially long shapes linearly extending in the direction of propagation of the SAW (D1 axis direction) with constant widths. The strip electrodes 37 are formed in substantially long shapes so as to linearly extend in the direction (D2 axis direction) perpendicular to the direction of propagation of the SAW with constant widths. The plurality of strip electrodes 37 are for example aligned in the direction of propagation of the SAW. The pitch of the plurality of strip electrodes 37 and the pitch between the mutually neighboring electrode fingers 31 and strip electrodes 37 are basically equivalent to the pitch of the plurality of electrode fingers 31.

Note that, although not particularly shown, the upper surface 3a of the substrate 3 may be covered by a protective film made of $SiO_2$ or the like from the tops of the IDT electrode 23 and reflectors 25 as well. The protective film may be one for simply suppressing corrosion of the IDT electrode 23 etc. or may be one contributing to temperature compensation. Further, in a case where a protective film is provided or the like, in order to improve the reflection coefficient of the SAW, an additional film made of an insulator or metal may be provided on the upper surfaces or lower surfaces of the IDT electrode 23 and reflectors 25 as well.

Where the protective film is provided, the protective film may be interposed between the substrate 3 and the frame 13 or may not be interposed. That is, the cover 7 may be directly placed on the upper surface 3a of the substrate 3 or may be placed indirectly.

By application of voltage to the upper surface 3a of the substrate 3 by the IDT electrode 23, the SAW propagating in the D1 axis direction on the upper surface 3a is excited. In the SAW resonator 19, a resonance frequency becomes substantially equivalent to the frequency of the SAW having the pitch "p" of the electrode fingers 31 as a half wavelength. The antiresonance frequency is determined by the resonance frequency and capacity ratio. The capacity ratio is mainly determined by the substrate 3 and is adjusted according to the number, intersecting width or film thickness of the electrode fingers 31 or the like. A capacity element connected parallel to the pair of comb-shaped electrodes 27 may be provided as well.

(Multiplexer Body)

FIG. 3A is a plan view showing the configuration of the multiplexer body 5. In this view, each of a range of arrangement of an IDT electrode 23 and ranges of arrangement of the reflectors 25 are shown by rectangles (see rectangles given notation 47A). Note that, the IDT electrode 23 (and reflectors 25) may be divided in the D2 axis direction (may be configured by a plurality of IDT electrodes). However, even in such an aspect, they are shown by one rectangle. Further, in this view, the planar shapes of the spaces 17 (inner edges of the frames 13) are indicated by two-dot chain lines.

The multiplexer body 5 has a plurality of pads (39A, 39T, 39R, 39G1 to 39G5, below, sometimes referred to as the "pads 39") connected to the plurality of terminals 9, a transmission filter 41 and receiving filter 43 which are connected through the pads 39 to the terminals 9, and wirings 45 supplied for the connection of the same. The wirings 45 are supplied for connection of the pads 39 and the filters (41 or 43) or connection in the filters (41 or 43).

The pads 39, transmission filter 41, receiving filter 43, and wirings 45 are configured by provision of a conductive layer on the upper surface 3a. The conductors may be configured by a conductive layer having the same material and thickness as those of the conductive layer configuring the IDT electrodes 23 and reflectors 25. Note that, the pads 39 may include a conductive layer made of another material on the conductive layer common to the other portions as well. Further, while not required in the illustrated example, depending on the configuration of the multiplexer body 5, an insulation layer and three-dimensionally intersecting interconnects may be provided on the wirings 45 configured by the same conductive layer as the conductive layer configuring the IDT electrodes 23.

On the plurality of pads 39, a plurality of terminals 9 are provided. Specifically, the antenna terminal 9A is positioned on the antenna pad 39A. The transmission terminal 9T is positioned on the transmission pad 39T. The reception terminal 9R is positioned on the reception pad 39R. The first GND terminal 9G1 to the fifth GND terminal 9G5 are positioned on the first GND pad 39G1 to the fifth GND pad 39G5 (below, sometimes simply referred to as the "GND pads 39G"). The already given explanation concerning the arrangement of the plurality of terminals 9 when viewed on a plane applies to the arrangement of the plurality of pads 39 when viewed on a plane.

(Transmission Filter and Receiving Filter)

The transmission filter 41 is positioned in a signal path connecting the antenna pad 39A and the transmission pad 39T, filters the signals input to the transmission pad 39T, and outputs the result to the antenna pad 39A. The receiving filter 43 is positioned in a signal path connecting the antenna pad 39A and the reception pad 39R, filters the signals input to the antenna pad 39A, and outputs the result to the reception pad 39R.

Each of the transmission filter 41 and receiving filter 43 is configured by a ladder type filter in the example shown. Specifically, this is as follows.

The transmission filter 41 includes for example a plurality of (four in the example shown) resonators of the first serial resonator 47A to fourth serial resonator 47D connected in series between the transmission pad 39A and the antenna pad 39A and a plurality of (three in the example shown)

resonators of the first parallel resonator 49A to third parallel resonator 49C connecting that serial line and the GND pad 39G.

The receiving filter 43 includes for example a plurality of (four in the example shown) resonators of the first serial resonator 51A to fourth serial resonator 51D connected in series between the antenna pad 39A and the reception pad 39R and a plurality of (three in the example shown) resonators of the first parallel resonator 53A to third parallel resonator 53C connecting that serial line and the GND pad 39G.

Each of the serial resonators 47 and parallel resonators 49 in the transmission filter 41 and the serial resonators 51 and parallel resonators 53 in the receiving filter 43 is configured by a SAW resonator 19 explained with reference to FIG. 2. However, the pitch, number, width, and/or intersecting width of the electrode fingers 31 or the like are suitably set for each resonator.

Both of the transmission filter 41 and receiving filter 43 are ladder type filters. Therefore, below, sometimes a ladder type filter will be explained by using notations of the transmission filter 41, and notations of the receiving filter 43 corresponding to those notations will be attached in parentheses.

In each serial resonator 47 (51), one comb-shaped electrode 27 in the pair of comb-shaped electrodes 27 is connected to the antenna pad 39A directly or indirectly through the other serial resonator 47 (51), and the other comb-shaped electrode 27 is connected to the transmission pad 39T (39R) directly or indirectly through the other serial resonator 47 (51). In each parallel resonator 49 (53), one comb-shaped electrode 27 in the pair of comb-shaped electrodes 27 is connected to a serial line (serial arm) connecting the antenna pad 39A and the transmission pad 39T (39R), and the other comb-shaped electrode 27 is connected to the GND pad 39G.

The frequency characteristics (for example resonance frequency and antiresonance frequency) of the plurality of serial resonators 47 (51) are basically the same as each other. The frequency characteristics (for example resonance frequency and antiresonance frequency) of the plurality of parallel resonators 49 (53) are basically the same as each other. Further, the serial resonators 47 (51) and the parallel resonators 49 (53) are basically set in their characteristics so that the antiresonance frequencies of the parallel resonators 49 (53) substantially coincide with the resonance frequencies of the serial resonators 47 (51). Further, where the frequency difference between the resonance frequency and the antiresonance frequency in each resonator is Δf, a range obtained by adding Δf of the serial resonator 47 (51) and Δf of the parallel resonator 49 (53) to each other (in more detail, a range narrower a little than this) becomes substantially the passing frequency band (passband).

The numbers of the serial resonators 47 (51) and parallel resonator 49 (53) may be suitably set. In principle, there may be one each as well. Further, the plurality of serial resonators 47 (51) may be finely adjusted so that the resonance frequencies and the antiresonance frequencies are a bit different from each other. In the same way, the plurality of parallel resonators 49 (53) may be finely adjusted so that the resonance frequencies and the antiresonance frequencies are a bit different from each other. The transmission filters 41 (43) may include configurations other than the resonators such as inductors or capacity elements at suitable positions as well.

The transmission filter 41 and the receiving filter 43 are different in passband from each other. For example, the passband of the receiving filter 43 is higher than the passband of the transmission filter 41.

The transmission filter 41 and the receiving filter 43 are configured in mutually different regions on the upper surface 3a of the substrate 3. The mutually different regions are for example substantially a half on the positive side of the D1 axis direction and a half on the negative side of the D1 axis direction. Further, for example, the transmission filter 41 and the receiving filter 43 are configured so as to individually fall into divided regions when dividing the upper surface 3a by a division line parallel to the mutually facing two sides among the four sides of the upper surface 3a. This division line is for example positioned at the center of each of the sides to which the division line is perpendicular (for example within a range of the central divided side among three equally divided sides as already explained).

Note that, in the transmission filter 41 (43), the wirings 45 connecting the resonators to each other are included in the transmission filter 41 (43). The wirings 45 which are connected to (continue with) the antenna pad 39A, the transmission pad 39T (39R) or GND pad 39G are not included in the filter.

The first GND pad 39G1 to the third GND pad 39G3 are for example connected to the transmission filter 41 (the reflectors 25 or the comb-shaped electrode 27 in the parallel resonator 49). The third GND pad 39G3 is for example connected to at least one parallel resonator.

The fourth GND pad 39G4 and the fifth GND pad 39G5 are for example connected to the receiving filter 43 (the comb-shaped electrodes 27 in the parallel resonators 53). In the connection positions with respect to the serial line formed by the plurality of serial resonators 51, the fourth GND pad 39G4 is positioned on the side closer to the antenna pad 39A than the fifth GND pad 39G5 while sandwiching at least one serial resonator 51 therebetween.

Between the substrate 3 and the cover 7, for example, two spaces 17 in total of a space 17 positioned above the transmission filter 41 and a space 17 positioned above the receiving filter 43 are formed. Note that, one space 17 covering the two of the transmission filter 41 and receiving filter 43 may be formed or two or more spaces 17 may be formed for each filter (41 or 43).

(Planar Shape of Reinforcing Layer)

FIG. 3B is a transparent projection view for explaining the planar shape of the reinforcing layer 11. This view is substantially obtained by adding the arrangement region of the reinforcing layer 11 to FIG. 3A. The hatched regions are regions where the reinforcing layer 11 is arranged. In a transparent projection view, the planar shapes of the terminals 9 and the planar shapes of the pads 39 may substantially coincide. In FIG. 3B, regions (circles) with notations of the terminals 9 may be grasped as regions for the pads 39.

The reinforcing layer 11 is for example divided into a plurality of (two in the example shown) areas and mainly includes a first area part 57A facing the transmission filter 41 and a second area part 57B facing the receiving filter 43. Note that, when referring to "the two area parts 57 are separated", it designates a state where the two are separated even if the terminals 9 (their upper end parts) are regarded as single portions of the reinforcing layer 11.

The first area part 57A for example faces all resonators (47 and 49) in the transmission filter 41. Further, the first area part 57A for example faces a portion of the receiving filter 43 as well. Specifically, for example, the first area part 57A faces the portion of the plurality of resonators on the antenna pad 39A side in the receiving filter 43 (in the example shown, 51A, 51B, 53A, and 53B).

The second area part 57B for example faces the remaining resonators (51C, 51D, and 53C) in the receiving filter 43. That is, the second area part 57B faces the portion of the plurality of resonators on the reception pad 39R side in the receiving filter 43.

The entire reinforcing layer 11 for example faces all resonators (47, 49, 51, and 53) in the transmission filter 41 and receiving filter 43. However, there may be a resonator which does not face the reinforcing layer 11 as well. Each area part 57 for example faces the entireties of the IDT electrodes 23 and the pair of reflectors 25 in the resonators. However, it may face only parts of the resonators, for example, may face only the IDT electrodes 23.

In the receiving filter 43, the boundary between the resonator facing the first area part 57A and the resonator facing the second area part 57B may be suitably set. For example, the first area part 57A faces at least the first serial resonator 51A (serial resonator 51 on the side closest to the antenna terminal 9A), while the second area part 57B faces at least the fourth serial resonator 51D (serial resonator 51 on the side closest to the reception terminal 9R).

The first area part 57A, when viewed on a plane, has a notch portion 59 positioned between the transmission filter 41 and the portion in the receiving filter 43 which faces the first area part 57A. The notch portion 59, in the example shown, starts from a gap between the third GND terminal 9G3 and the transmission filter 41 (more specifically, the third parallel resonator 49C) and extends toward the antenna terminal 9A side.

The notch portion 59 for example includes a slit portion 59A having a width narrower relative to the length. The slit portion 59a for example linearly extends with substantially a constant width. The width of the slit portion 59a is for example narrower than the width of a partition wall between the two spaces 17 in the frame 13. The slit portion 59a may fall into the partition wall in a transparent projection view as well. Note that, in the example shown, the slit portion 59a occupies the majority of the notch portion 59. However, the notch portion 59 may include the portion changing its width (for example a size in the D1 axis direction or the direction in which the two filters are arranged) in part or all of it as well.

The first area part 57A is for example connected to the GND terminals 9G (their flange shaped portions). More specifically, for example, the first area part 57A is connected to the GND terminals 9G (9G1 to 9G3) connected to the transmission filter 41 and to the GND terminal 9G (9G4) connected to the receiving filter 43. In further detail, the first area part 57A is connected to all of the GND terminals 9G connected to the transmission filter 41. Further, the first area part 57A, among the GND terminals 9G connected to the receiving filter 43, is connected to the fourth GND terminal 9G4 connected on the antenna terminal 9A side relative to the serial line formed by the plurality of serial resonators 51.

The second area part 57B is for example connected to the GND terminal 9G (its flange shaped portion). More specifically, for example, the second area part 57B is connected to the GND terminal 9G (9G5) connected to the receiving filter 43. In further detail, the second area part 57B, among the GND terminals 9G connected to the receiving filter 43, is connected to the fifth GND terminal 9G5 connected on the reception terminal 9R side relative to the serial line formed by the plurality of serial resonators 51.

Note that, as understood from the above description, the first area part 57A and the second area part 57B are not directly connected. "Directly connected" means an electrical connection without going through an electronic device. The "electronic device" is for example a resistor, capacitor, inductor, resonator, or filter. Note that, the resistance etc. which is unavoidably generated in a wiring is not included in the electronic device referred to here.

As described above, in the present embodiment, the multiplexer 1 includes the substrate 3, the plurality of IDT electrodes 23 positioned on the upper surface 3a of the substrate 3, the insulating cover 7 positioned on the upper surface 3a so as to configure the spaces 17 above the plurality of IDT electrodes 23, the antenna terminal 9A, transmission terminal 9T, and reception terminal 9R which are all positioned on the upper surface 3a and pass through the cover 7, and the reinforcing layer 11 which is positioned on the cover 7 and is made of metal. The plurality of IDT electrodes 23 form the transmission filter 41 positioned in the signal path connecting the antenna terminal 9A and the transmission terminal 9T and the receiving filter 43 positioned in the signal path connecting the antenna terminal 9A and the reception terminal 9R. The reinforcing layer 11 has the first area part 57A facing the transmission filter 41 and the second area part 57B which faces the receiving filter 43 and is separated from the first area part 57A.

Accordingly, for example the probability of coupling of the transmission filter 41 and the receiving filter 43 through the reinforcing layer 11 is reduced, therefore the isolation is improved.

Further, in the present embodiment, the multiplexer 1 has the GND terminals 9G which are positioned on the upper surface 3a of the substrate 3 and pass through the cover 7. The first area part 57A is connected to the first GND terminal 9G1 to the fourth GND terminal 9G4, while the second area part 57B is connected to the fifth GND terminal 9G5.

Accordingly, for example, the probability of the appearance of an unintended characteristic can be reduced by stabilizing the potentials of the two separated area parts 57. Further, for example, in comparison with an aspect completely separating the two area parts 57 from the terminals 9 (this aspect is also included in the art according to the present disclosure), the area parts 57 are supported by the columnar terminals 9, therefore the effect of reinforcement is improved.

Further, in the present embodiment, the receiving filter 43 has a plurality of resonators (51 and 53). The first area part 57A faces one portion of the plurality of resonators (51 and 53) in addition to the transmission filter 41. The second area part 57B faces another portion of the plurality of resonators (51 and 53).

Accordingly, for example, the effect of improvement of isolation due to separation of the reinforcing layer 11 is obtained, while the first area part 57A can be formed relatively broader. By making the first area part 57A broader, for example, the effect of reinforcement can be raised and the potentials can be stabilized by increasing the number of the GND terminals 9G connected to the first area part 57A. Further, in the simulation calculation which will be explained later, for example, the configuration as described above was improved more in isolation in comparison with an aspect where the first area part 57A faces only the transmission filter 41.

Further, in the present embodiment, the receiving filter 43 facing the second area part 57B is one outputting the signal input to the antenna terminal 9A to the reception terminal 9R. The second serial resonator 51B (or first serial resonator 51A) and the third serial resonator 51C (or fourth serial resonator 51D) are connected in series to each other between the antenna terminal 9A and the reception terminal 9R so that the third serial resonator 51C becomes closer to the reception terminal 9R side than the second serial resonator 51B. The first area part 57A, in the receiving filter 43, faces only the portion (51A, 51B, 53A and/or 53B) located closer to the antenna terminal 9A side than the third serial resonator 51C in the signal path. The second area part 57B, in the receiving filter 43, faces only the portion (51C, 51D and/or 53C) located closer to the reception terminal 9R side than the second serial resonator 51B.

Accordingly, for example, even if the first area part 57A exerts an influence upon the reception signals from the antenna terminal 9A, after that, the reception signals are filtered by a portion in the receiving filter 43 that the first area part 57A does not face. As a result, the first area part 57A is made broader as explained above, while the effect of improving the isolation due to separation of the reinforcing layer 11 is improved. Further, in the simulation calculation which will be explained later, for example, the configuration as described above was improved more in isolation in comparison with an aspect excluding the region in the reinforcing layer 11 which faces a portion of the transmission filter 41 (aspect of reducing the coupling for a portion of the transmission filter 41).

Further, in the present embodiment, the passband of the receiving filter 43 is higher than the passband of the transmission filter 41. That is, in the reinforcing layer 11, the region (57B) facing a portion of the filter (43) having a higher passband between the two filters (41 and 43) is separated from the other region (57A)

Accordingly, for example, the isolation is improved in the portion of the receiving filter 43 in which the pitch of the electrode fingers 31 must be made smaller corresponding to the frequency being higher. As a result, for example, superimposition of the variation due to precisions of the electrode fingers 31 and the drop in isolation due to a coupling through the reinforcing layer 11 is reduced, therefore the filter characteristics are improved. Further, in the simulation calculation which will be explained later, for example, the configuration as described above was improved more in isolation in comparison with an aspect excluding the region in the reinforcing layer 11 which faces a portion of the filter (41) having a lower frequency (aspect of reducing the coupling for a portion of the transmission filter 41).

Further, in the present embodiment, the first area part 57A facing the transmission filter 41 and a portion in the receiving filter 43 (second serial resonator 51B and/or first serial resonator 51A) has the notch portion 59 positioned between the transmission filter 41 and the above portion in the receiving filter 43 when viewed on a plane.

Accordingly, the reinforcing layer 11 (first area part 57A) is formed so as to cover the two filters (41 and 43) while the probability of coupling of the two filters by the reinforcing layer 11 can be reduced.

Further, in the present embodiment, the portion in the reinforcing layer 11 connected with the third GND terminal 9G3 extends so as to partition the region in which the transmission filter 41 and the receiving filter 43 are arranged and extends so as to overlap the wirings connected to the reference potential in the transmission filter 41. Accordingly, the reference potential can be stably realized.

Further, in the present embodiment, the notch portion 59 (59a) is formed in a place that separates the wirings connected to the reference potential in the transmission filter 41 and the resonators in the transmission filter 41. Accordingly, the isolation can be raised more.

Further, in the present embodiment, although not shown, the notch portion 59 may be formed also on the receiving filter 43 side. Due to this, it is possible to separate the receiving filter 43 and the reference potentials of the transmission filter 41 (first filter), therefore the isolation can be raised more.

Further, in the present embodiment, the direction (D1 axis direction) in which the transmission filter 41 (first filter) and the receiving filter 43 (second filter) are arranged and the direction of propagation of the SAW substantially coincide. In other words, the resonators in the receiving filter 43 are present in the direction on the extended line of the direction of propagation of the SAW from the resonators in the transmission filter 41.

In the above such configuration, isolation becomes severer than usual. It is due to this arrangement that the necessity of the configuration of the reinforcing layer 11 explained above rises. For example, unlike the present embodiment, when the direction in which the two filters are aligned is the D1 axis direction and the direction of propagation of the SAW is the D2 axis direction, in the transmission filter, the resonator on the side close to the transmission terminal is far from the receiving filter, therefore the two filters are resistant to coupling.

Note that, in the example explained above, the explanation was given by using an example in which the both of the transmission filter 41 (first filter) and the receiving filter 43 (second filter) were configured by ladder type filters, but the present disclosure is not limited to this example. For example, as the receiving filter 43, two stages of DMS filters may be provided, the DMS filter on the antenna side and the first area part may be made to overlap, and the DMS filter on the reception terminal side and the second area part may be made to overlap. In the same way, as the receiving filter 43, use may be made of one formed by connecting a ladder type filter and a DMS filter so that the filter positioned on the antenna terminal side between the two filters overlaps the first area part and the filter positioned on the reception terminal side overlaps the second area part.

Further, the arrangement of the ladder type filter and the connection of it with respect to the plurality of GND terminals 9G are not limited to those in the example shown. For example, in the example shown, all parallel resonators 49 in the transmission filter 41 were connected to the same GND terminal (third GND terminal 9G3). However, a portion of the parallel resonator 49 may be connected to other GND terminals 9G as well.

Second Embodiment

Figure 4A:
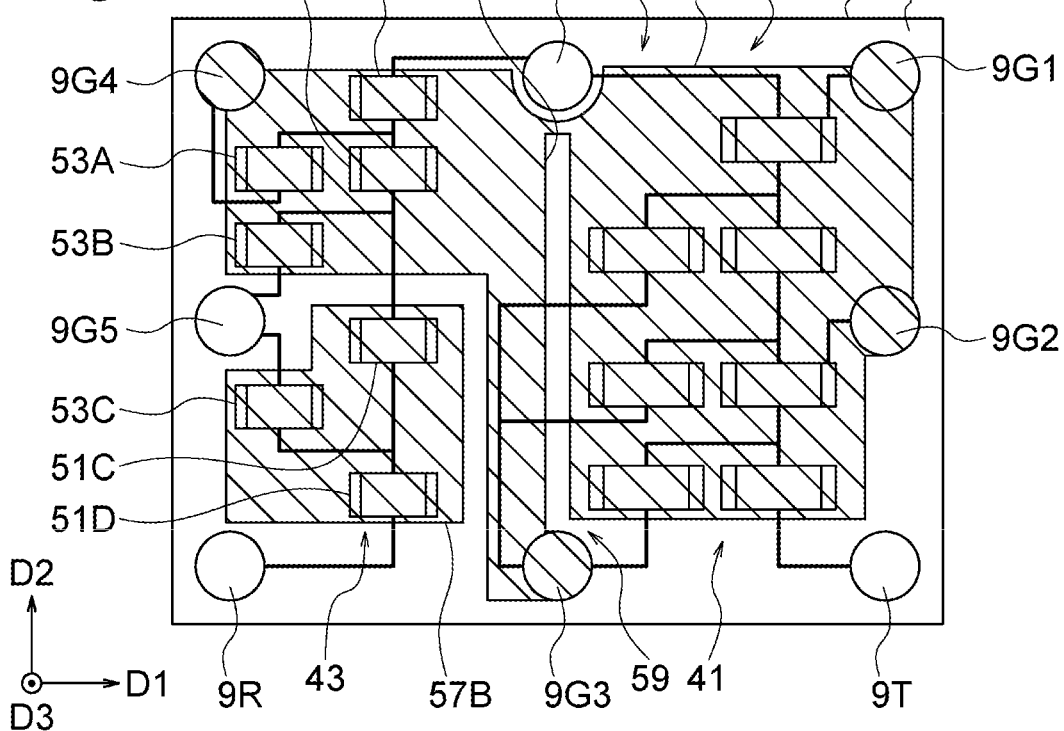
FIG. 4A is a transparent projection view showing the configuration of a multiplexer according to a second embodiment.

FIG. 4A is a view corresponding to FIG. 3B and shows the configuration of a multiplexer 201 according to a second embodiment.

The multiplexer 201 differs from the multiplexer 1 in the first embodiment only in the shape of the reinforcing layer. Specifically, in the reinforcing layer 211 in the present embodiment, the second area part 57B is not connected to the GND terminal 9G. The rest (the shape of the first area part 57A and the basic shape of the second area part 57B) are the same as in the first embodiment.

In this way, in the present embodiment, the first area part 57A is connected to the GND terminals 9G, while the second area part 57B is made an electrically floating state. Accordingly, for example, the second area part 57B need not to be connected to the GND terminal 9G, therefore the degree of freedom of design of the reinforcing layer 211 is high. Further, in the simulation calculation which will be explained later, the isolation was improved more in the example according to the second embodiment than the example according to the first embodiment.

EXAMPLES

Simulation calculations were performed for investigating the characteristics of multiplexers assuming various planar shapes of reinforcing layers in comparative examples and examples.

The configurations of the multiplexers according to the plurality of examples and plurality of comparative examples explained below are the same other than the planar shapes of the reinforcing layers. The multiplexers were made ones corresponding to the high band. Note that, in these examples, the frequency is set higher in the receiving band than the transmission band.

Figure 4B:
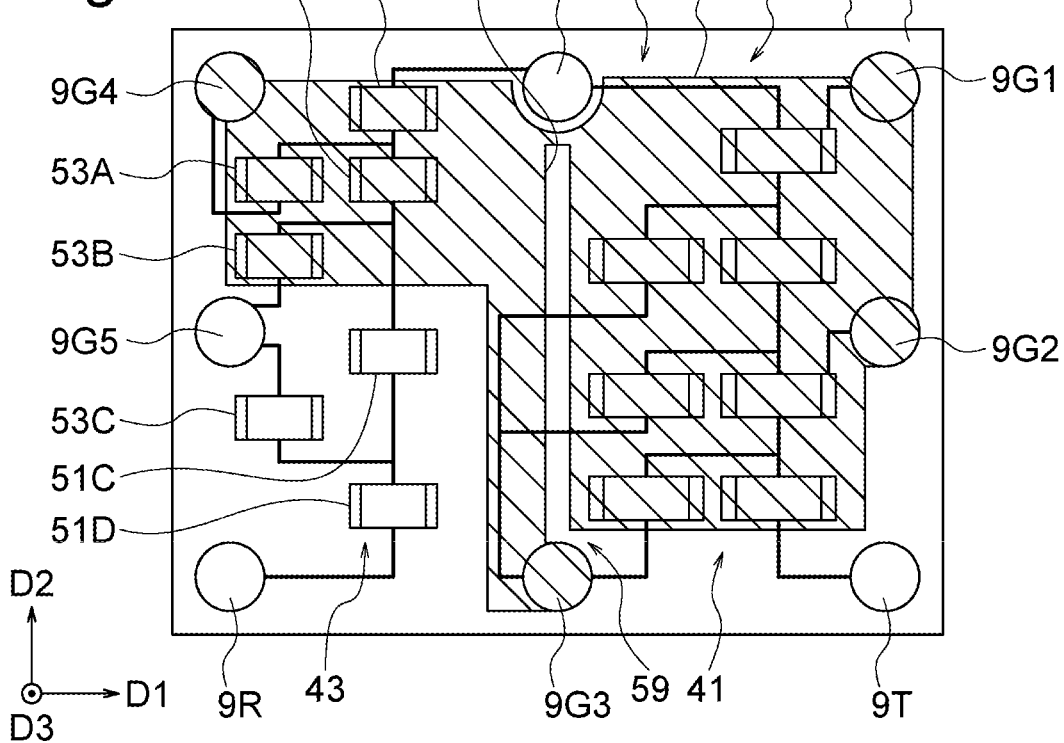
FIG. 4B is a transparent projection view showing the configuration of a multiplexer according to a first comparative example.

FIG. 4B is a view corresponding to FIG. 3B and shows the configuration of a multiplexer 301 in a first comparative example. A reinforcing layer 303 in this multiplexer 301 differs from the reinforcing layers in the first embodiment and second embodiment only in the point that the second area part 57B is not provided.

FIG. 5A to FIG. 5E show results of simulation calculation for an example according to the first embodiment (first example), an example according to the second embodiment (second example), and the first comparative example.

Figure 5A:
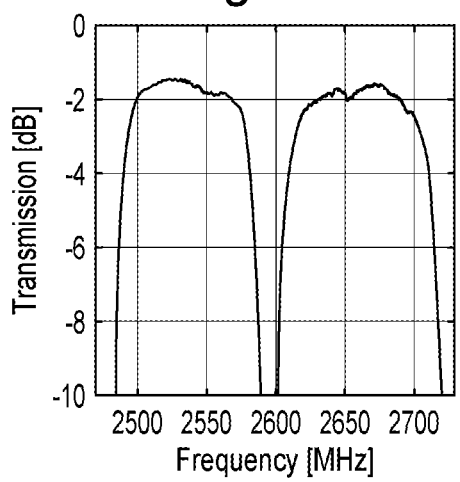
FIG. 5A, FIG. 5B, FIG. 5C, FIG. 5D, and FIG. 5E are graphs showing results of simulation calculation for a first example, a second example, and the first comparative example.
Figure 5B:
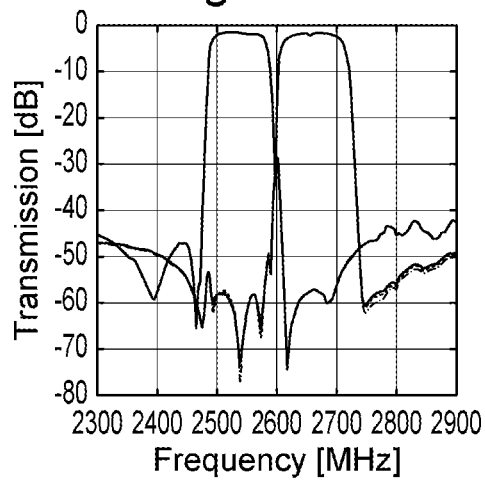
Figure 5C:
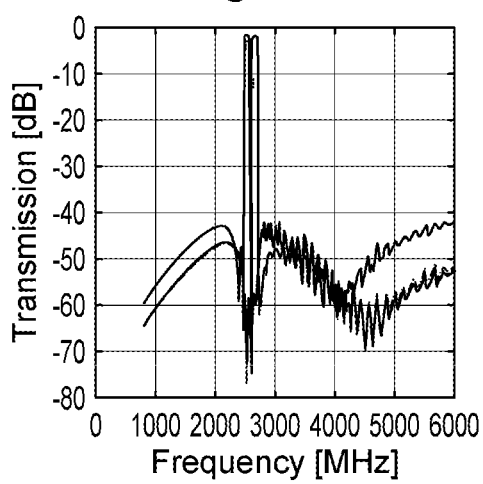
Figure 5D:
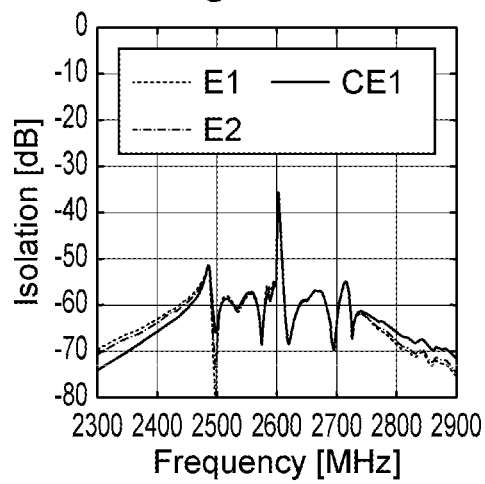
Figure 5E:
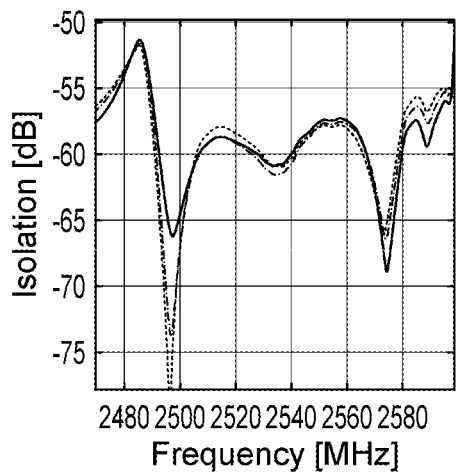
Figure 7A:
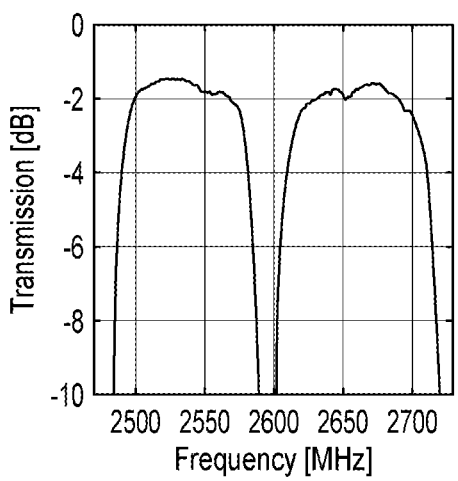
FIG. 7A, FIG. 7B, FIG. 7C, FIG. 7D, and FIG. 7E are graphs showing the results of simulation calculation for the first example, second example, and third comparative example.
Figure 7B:
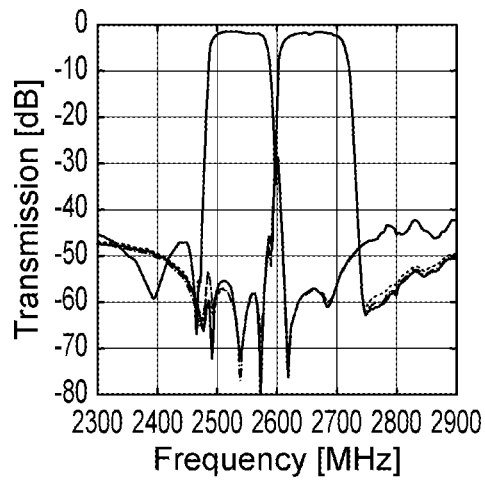
Figure 7C:
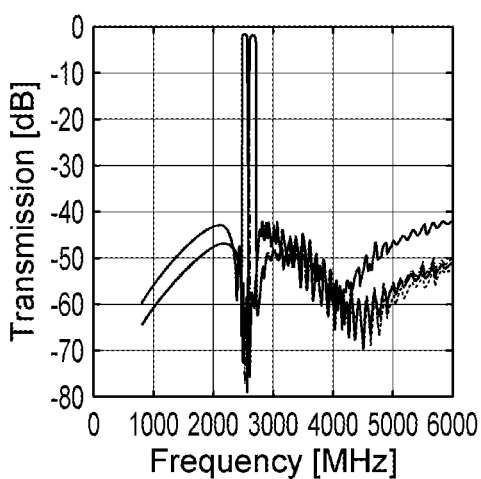
Figure 7D:
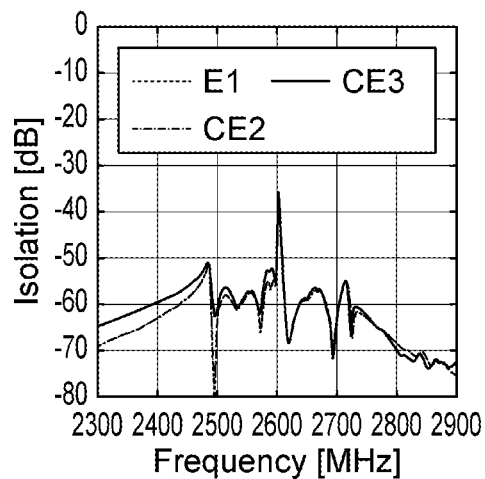
Figure 7E:
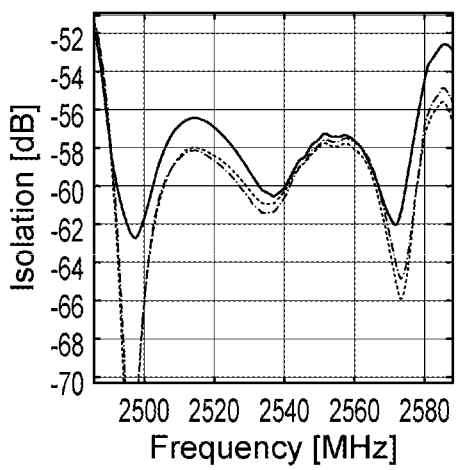
Figure 9A:
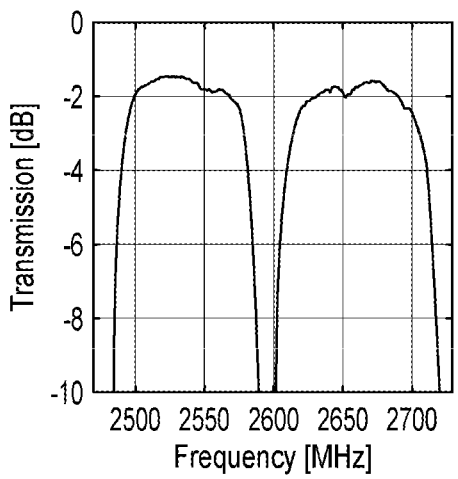
FIG. 9A, FIG. 9B, FIG. 9C, FIG. 9D, and FIG. 9E are graphs showing the results of simulation calculation for the first embodiment, fourth comparative example, and fifth comparative example.
Figure 9B:
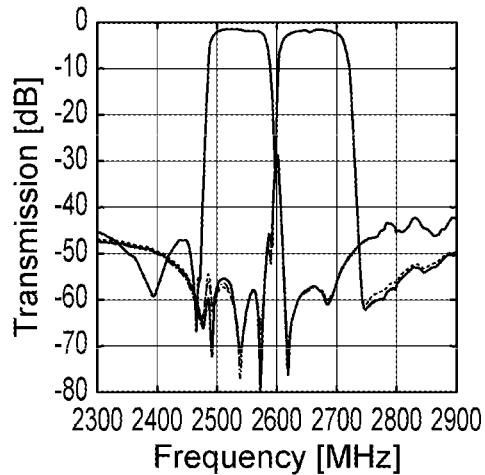
Figure 9C:
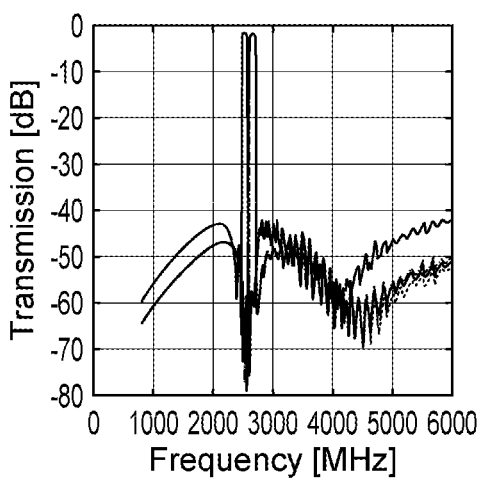
Figure 9D:
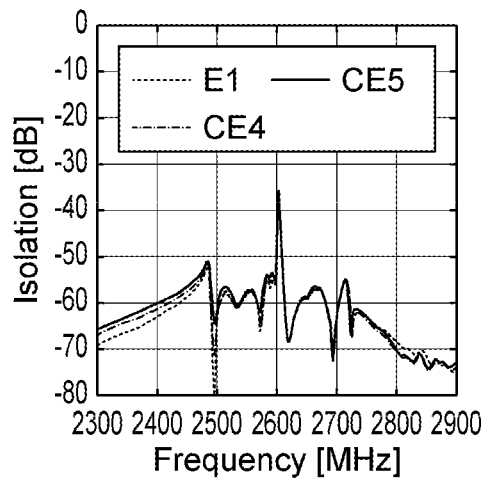
Figure 9E:
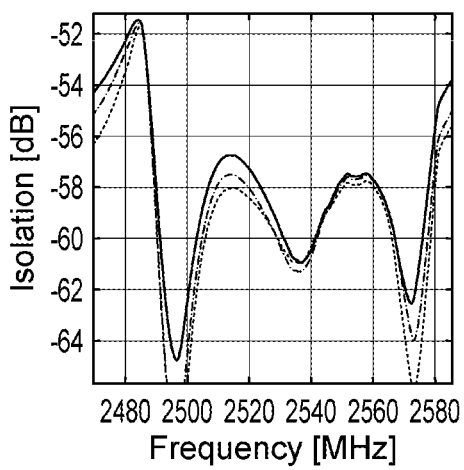

FIG. 5A shows the transmission characteristics of the multiplexers. FIG. 5B shows the transmission characteristics of the multiplexers in a broader frequency range and broader transmission characteristic range than those in FIG. 5A. FIG. 5C shows the transmission characteristics of the multiplexers in a further broader frequency range than that in FIG. 5B. FIG. 5D shows isolation characteristics of the multiplexers. FIG. 5E is an enlarged graph of a portion (transmission band) in FIG. 5D.

In FIG. 5A to FIG. 5E, the abscissas show the frequencies (MHz), and the ordinates show the characteristics (dB). The notations assigned to the types of lines are as follows: E1: first example (FIG. 3B), E2: second example (FIG. 4A), and CE1: first comparative example (FIG. 4B).

It will be understood these graphs (particularly FIG. 5E) that characteristics which are substantially equivalent to each other are obtained in the first example, second example, and first comparative example. That is, in first and second examples, by providing the second area part 57B, the effect of reinforcing the cover 7 more than the first comparative example is obtained, while an effect of improving the isolation equivalent to that in the case where the second area part 57B is omitted is obtained. Further, when comparing the first example and second example, as a whole, a bit better isolation characteristic is obtained in the second example. Further, when focusing on the maximum value of the characteristics from 2500 MHz to 2570 MHz, it can be confirmed that first example and second example are improved in comparison with the first comparative example.

FIG. 6A is a view corresponding to FIG. 3B and shows the configuration of a multiplexer 311 in a second comparative example. A reinforcing layer 313 in this multiplexer 311 differs from the reinforcing layer 211 in the second embodiment only on the point that the second area part 57B and the first area part 57A are connected on the positive side in the D2 axis direction of the second area part 57B (connected in the direction in which the plurality of serial resonators 51 are aligned).

As a result of connection as described above, a portion of a clearance between the first area part 57A and the second area part 57B in the second embodiment (positive side in the D1 axis direction of the second area part 57B) becomes a notch portion 315 of the reinforcing layer 313 in the second comparative example. The notch portion 315 is positioned between the receiving filter 43 and the transmission filter 41. The notch portion 315 for example includes a slit portion 315a having a width narrower relative to the length. The slit portion 315a for example linearly extends with substantially a constant width. The width thereof is relatively narrow and is for example narrower than the width of the partition wall between the two spaces 17 in the frame 13.

FIG. 6B is a view corresponding to FIG. 3B and shows the configuration of a multiplexer 321 in a third comparative example. A reinforcing layer 323 in this multiplexer 321 differs from the reinforcing layer 313 in the second comparative example only on the point that the second area part 57B and the first area part 57A are connected even in the region which became the slit portion 315a in the second comparative example (FIG. 6A).

FIG. 7A to FIG. 7E are graphs corresponding to FIG. 5A to FIG. 5E and show the results of simulation calculation for the first example, second comparative example, and third comparative example. The notations assigned to the types of lines are as follows: E1: first example (FIG. 3B), CE2: second comparative example (FIG. 6A), and CE3: third comparative example (FIG. 6B).

The first example is better in the isolation characteristic than the second comparative example and third comparative example. That is, it was confirmed that the isolation characteristic was improved by separating the second area part 57B from the first area part 57A.

When comparing the second comparative example and third comparative example, the second comparative example is better in the isolation characteristic than the third comparative example. Accordingly, it was confirmed that the slit portion 315a (clearance between the first area part 57A and the second area part 57B in first example) positioned between the transmission filter 41 and the receiving filter 43 was useful for improvement of isolation.

FIG. 8A is a view corresponding to FIG. 3B and shows the configuration of a multiplexer 331 in a fourth comparative example. A reinforcing layer 333 in this multiplexer 331 differs from the reinforcing layer 211 in the second embodiment only on the point that the second area part 57B and the first area part 57A are connected on the positive side in the D1 axis direction of the second area part 57B (connected in the direction of arrangement of the transmission filter 41 and the receiving filter 43).

As a result of connection as described above, a portion of the clearance between the first area part 57A and the second area part 57B in the second embodiment (positive side in the D2 axis direction of the second area part 57B) becomes a notch portion 335 of the reinforcing layer 333 in the second comparative example. The notch portion 335 is positioned between a front stage portion and a rear stage portion of the receiving filter 43.

FIG. 8B is a view corresponding to FIG. 3B and shows the configuration of a multiplexer 341 in a fifth comparative example. A reinforcing layer 343 in this multiplexer 341 differs from the reinforcing layer 333 in the fourth comparative example only on the point that the second area part 57B and the first area part 57A are connected even in a portion on a deep side of the notch portion 335 in the fourth comparative example (FIG. 8A).

FIG. 9A to FIG. 9E are graphs corresponding to FIG. 5A to FIG. 5E and show the results of simulation calculation for the first example, fourth comparative example, and fifth comparative example. The notations assigned to the types of lines are as follows: E1: first example (FIG. 3B), CE4: fourth comparative example (FIG. 8A), and CE5: fifth comparative example (FIG. 8B).

The first example is better in isolation characteristic than the fourth comparative example and fifth comparative example. That is, it was confirmed that the isolation characteristic was improved by separating the second area part 57B from the first area part 57A. Further, when comparing the fourth comparative example and fifth comparative example, the isolation characteristic is better in the fourth comparative example than the fifth comparative example. Accordingly, it was confirmed that the slit portion between the first area part 57A and the second area part 57B was useful for improvement of isolation.

Figure 10A:
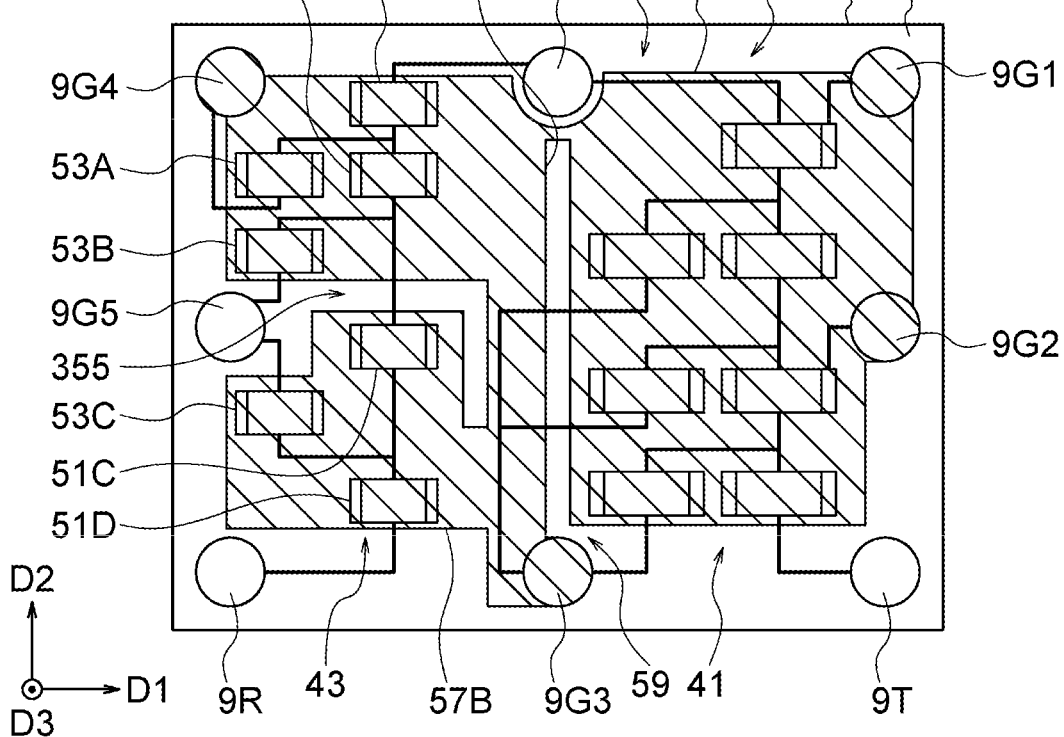
FIG. 10A is a transparent projection view showing the configuration of a multiplexer according to a sixth comparative example.

FIG. 10A is a view corresponding to FIG. 3B and shows the configuration of a multiplexer 351 in a sixth comparative example. A reinforcing layer 353 in this multiplexer 351 differs from the reinforcing layer 211 in the second embodiment only on the point that the second area part 57B and the first area part 57A are connected on the positive side in the D1 axis direction of the second area part 57B (connected in the direction of arrangement of the transmission filter 41 and the receiving filter 43).

This connection position is located closer to the negative side of the D2 axis direction in comparison with the fourth comparative example (FIG. 8A) where the two were connected on the positive side in the D1 axis direction of the second area part 57B in the same way as the present comparative example. More specifically, in contrast to the fourth comparative example in which the second area part 57B was connected to the first area part 57A at the position of the third serial resonator 51C, in the present comparative example, the second area part 57B is connected to the first area part 57A at the position of the fourth serial resonator 51D. Further, the notch portion 355 extends so as to partition the front stage portion and the rear stage portion of the receiving filter 43, then extends so as to partition the receiving filter 43 and the transmission filter 41.

Figure 10B:
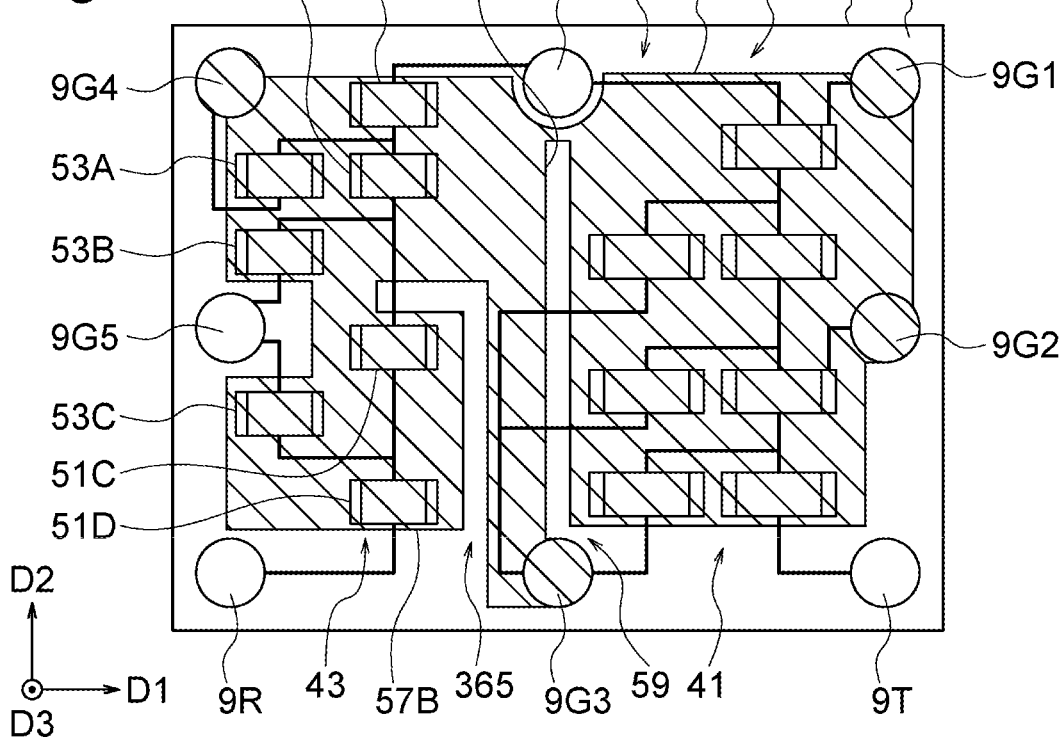
FIG. 10B is a transparent projection view showing the configuration of a multiplexer according to a seventh comparative example.
Figure 11A:
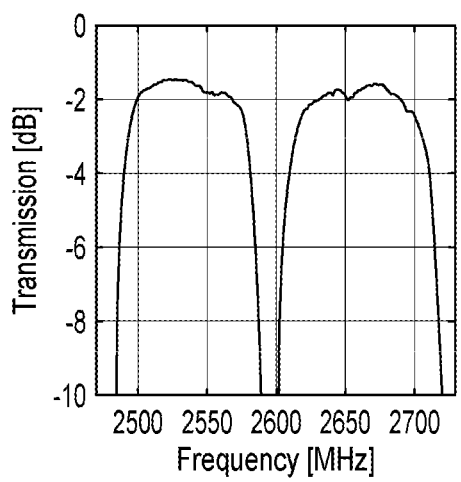
FIG. 11A, FIG. 11B, FIG. 11C, FIG. 11D, and FIG. 11E are graphs showing the results of simulation calculation for the first example, sixth comparative example, and seventh comparative example.
Figure 11B:
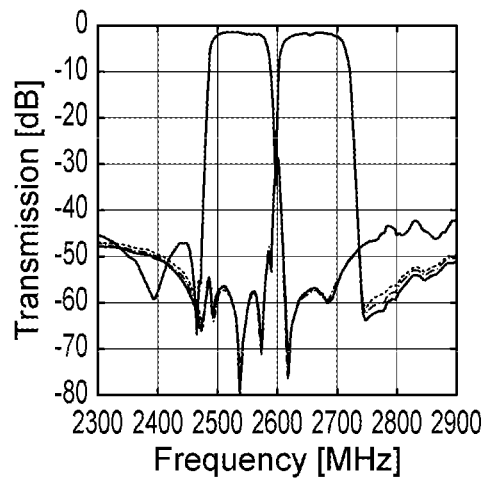
Figure 11C:
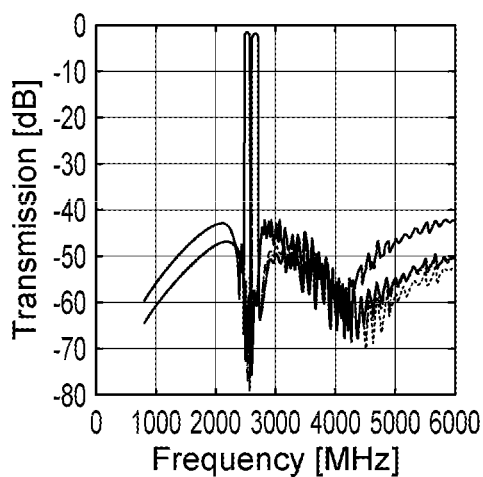
Figure 11D:
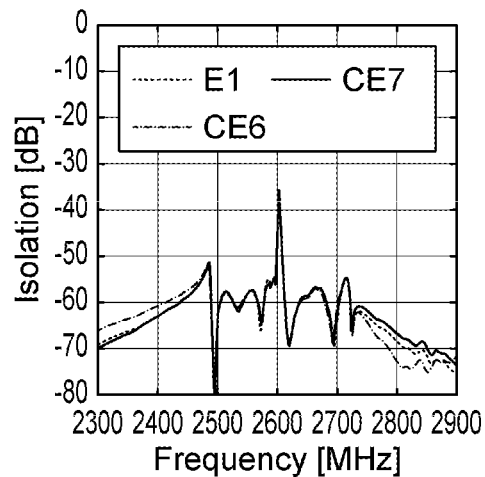
Figure 11E:
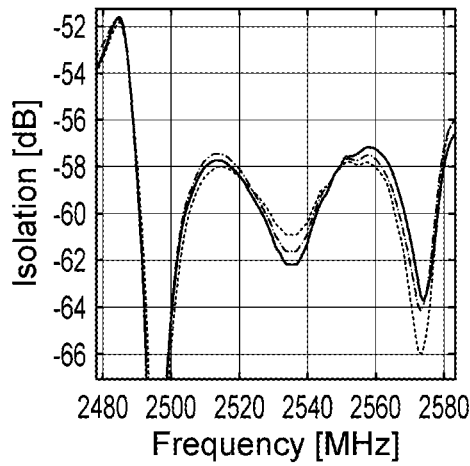

FIG. 10B is a view corresponding to FIG. 3B and shows the configuration of a multiplexer 361 in a seventh comparative example. A reinforcing layer 363 in this multiplexer 361 differs from the reinforcing layer 211 in the second embodiment only on the point that the second area part 57B and the first area part 57A are connected on the positive side in the D2 axis direction of the second area part 57B (connected in the direction in which the plurality of serial resonators 51 are aligned).

This connection position is limited to a portion on the negative side of the D1 axis direction in comparison with the second comparative example (FIG. 6A) in which the connection was carried out on the positive side in the D2 axis direction of the second area part 57B in the same way as the present comparative example. The notch portion 365 becomes broader or longer on a deeper side than the notch portion 315 in the second comparative example. Further, this is positioned also between the front stage portion and the rear stage portion of the receiving filter 43.

FIG. 11A to FIG. 11E are graphs corresponding to FIG. 5A to FIG. 5E and show the results of simulation calculation for the first example, sixth comparative example, and seventh comparative example. The notations assigned to the types of lines are as follows: E1: first example (FIG. 3B), CE6: sixth comparative example (FIG. 10A), and CE7: seventh comparative example (FIG. 10B).

The first example is better in the isolation characteristic than the sixth comparative example and seventh comparative example. That is, it was confirmed that the isolation characteristic was improved by separating the second area part 57B from the first area part 57A.

Figure 12:
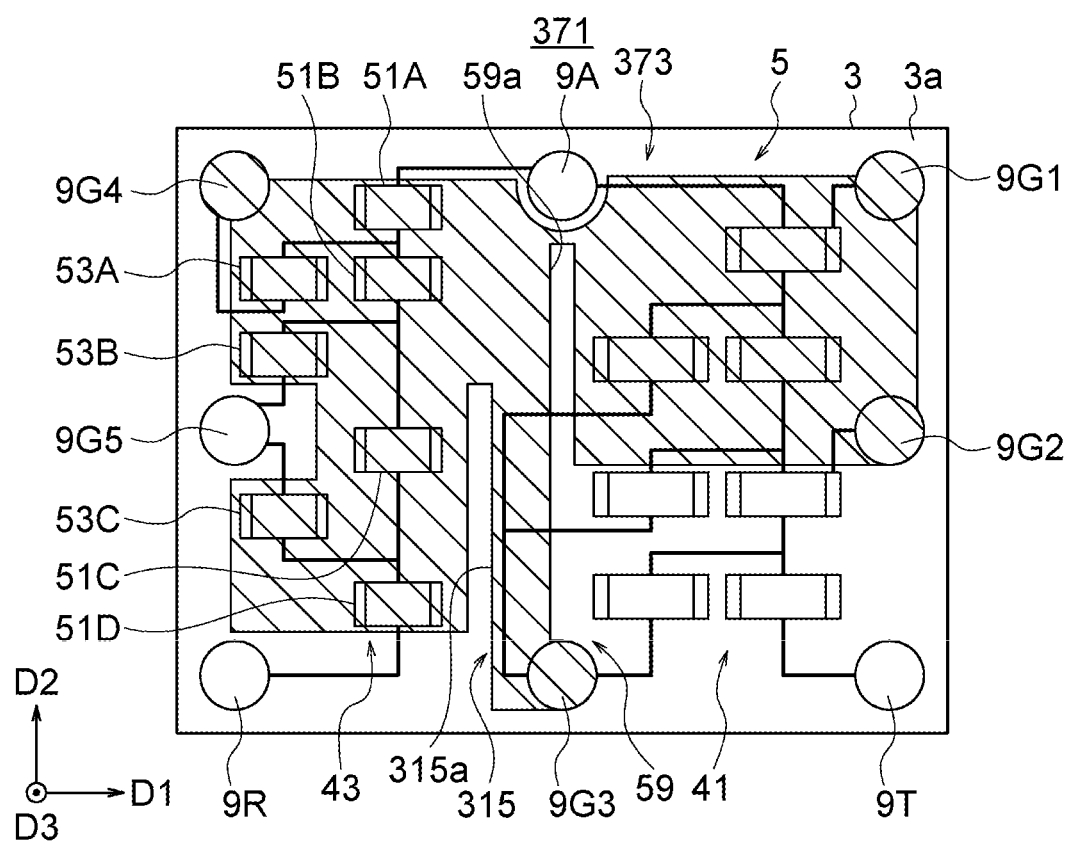
FIG. 12 is a transparent projection view showing the configuration of a multiplexer according to an eighth comparative example.
Figure 13A:
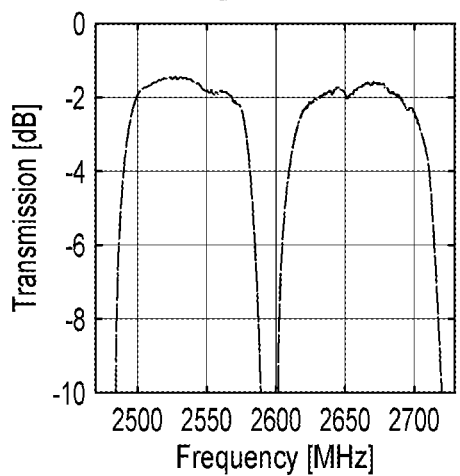
FIG. 13A, FIG. 13B, FIG. 13C, FIG. 13D, and FIG. 13E are graphs showing the results of simulation calculation for the first example and eighth comparative example.
Figure 13B:
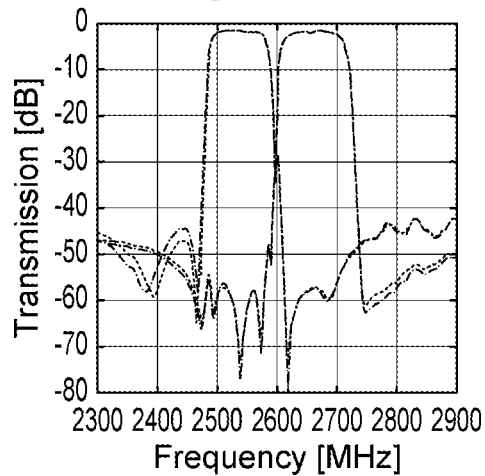
Figure 13C:
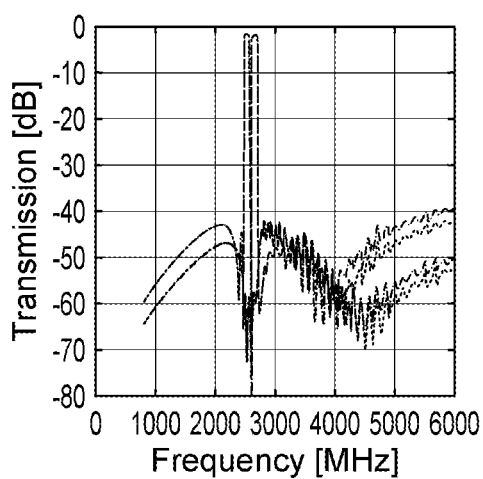
Figure 13D:
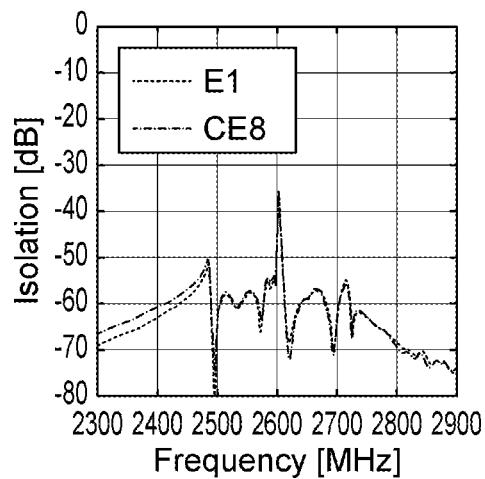
Figure 13E:
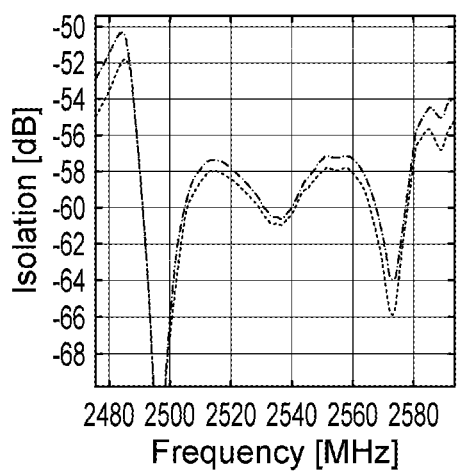

FIG. 12 is a view corresponding to FIG. 3B and shows the configuration of a multiplexer 371 in an eighth comparative example. A reinforcing layer 373 in this multiplexer 371 differs from the second comparative example (FIG. 6A) only on the point that a portion of the region facing the transmission filter 41 is omitted. From another viewpoint, in contrast to the first comparative example (FIG. 4B) in which the region in the reinforcing layer which faced a portion of the receiving filter 43 was omitted, in the present comparative example, the region in the reinforcing layer which faces a portion of the transmission filter 41 is omitted. Specifically, the reinforcing layer 373 faces only a portion on the antenna terminal 9A side (47A, 47B, and 49A) in the signal path in the transmission filter 41.

Note that, as shown in the results of simulation calculation for the first example, second example, and first comparative example (FIG. 5A to FIG. 5E), if a portion of the reinforcing layer is separated, the effect of improvement of isolation equivalent to the case where a part is omitted is obtained. Accordingly, it can be said that, in the isolation characteristic, the eighth comparative example shows also a filter separating a portion of the reinforcing layer.

FIG. 13A to FIG. 13E are graphs corresponding to FIG. 5A to FIG. 5E and show the results of simulation calculation for the first example and eighth comparative example. The notations assigned to the types of lines are as follows: E1: first example (FIG. 3B), and CE8: eighth comparative example (FIG. 12).

The first example is better in the isolation characteristic than the eighth comparative example. That is, in this result of simulation calculation, the isolation characteristic was improved more in the case where the region in the reinforcing layer which faced a portion of the receiving filter 43 on the reception terminal 9R side from the other region than the case where the region in the reinforcing layer which faced a portion of the transmission filter 41 on the transmission terminal 9T side was omitted (separated).

When comparing the results of simulation calculation between the second comparative example (FIG. 6A) and eighth comparative example, the isolation characteristic is better in the second comparative example. In these comparative examples, the coupling of the receiving filter 43 and the transmission filter 41 through the reinforcing layer is sufficiently suppressed by the notch portions 59 and 315, therefore it is considered that the effect by omitting the region in the reinforcing layer which faced a portion of the transmission filter 41 did not appear.

On the other hand, when comparing the results of simulation calculation between the third comparative example (FIG. 6B) and eighth comparative example, the isolation characteristic is better in the eighth comparative example. Accordingly, it can be said that, in a case where the notch portion 315 is not provided as in third comparative example, isolation is improved by omitting (or separating) the region facing a portion of the transmission filter 41.

Figure 14A:
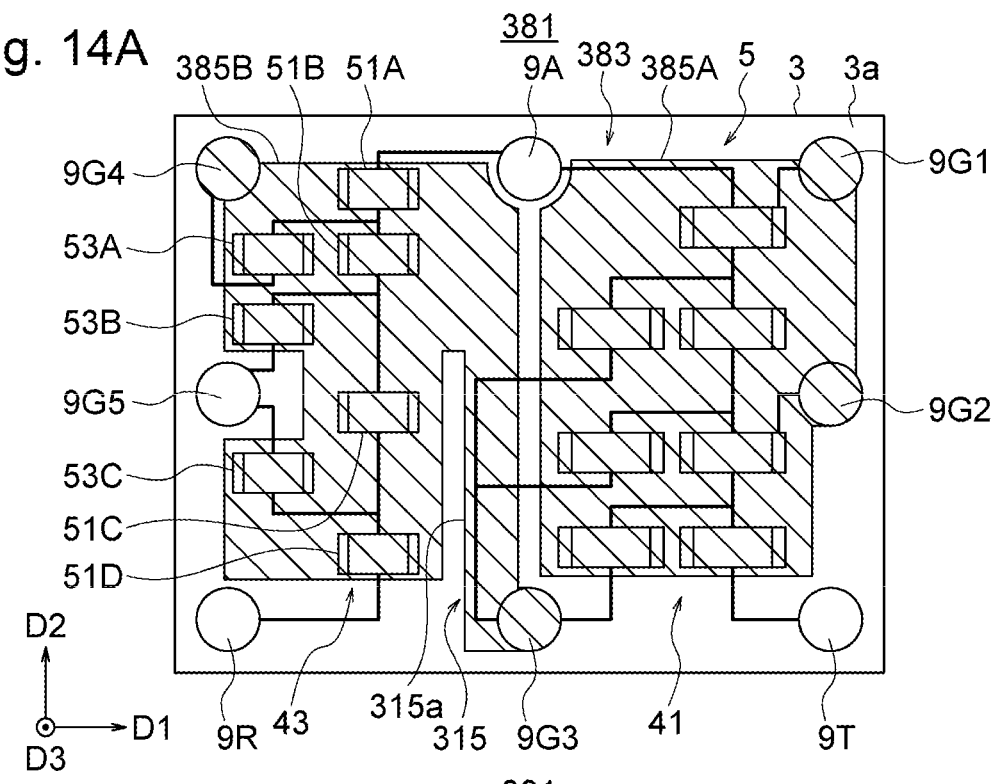
FIG. 14A is a transparent projection view showing the configuration of a multiplexer according to a ninth comparative example.

FIG. 14A is a view corresponding to FIG. 3B and shows the configuration of a multiplexer 381 in a ninth comparative example. A reinforcing layer 383 in this multiplexer 381 has a first area part 385A facing only the transmission filter 41 and a second area part 385B facing only the receiving filter 43. The first area part 385A faces for example the entirety (all resonators) of the transmission filter 41. The second area part 385B faces for example the entirety (all resonators) of the receiving filter 43. The specific shape of the reinforcing layer 383 is a shape where the slit portion 59a extends to the positive side of the D2 axis in the second comparative example (FIG. 6A).

Figure 14B:
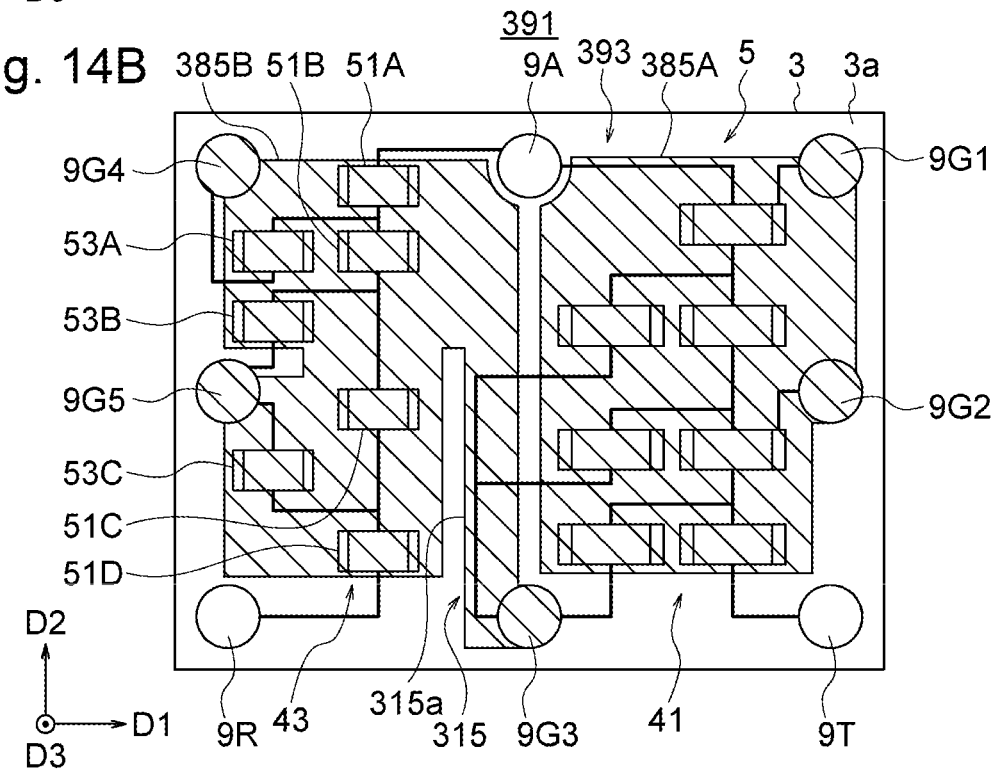
FIG. 14B is a transparent projection view showing the configuration of a multiplexer according to a 10th comparative example.
Figure 15A:
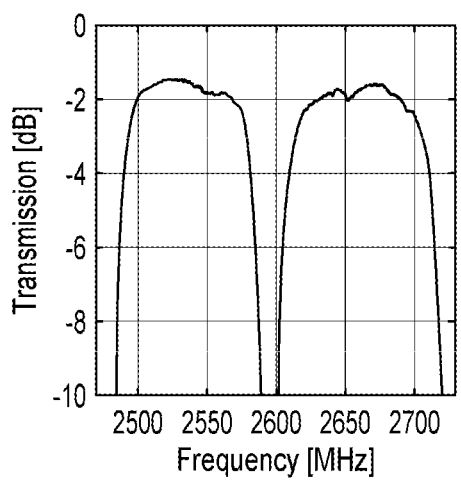
FIG. 15A, FIG. 15B, FIG. 15C, FIG. 15D, and FIG. 15E are graphs showing the results of simulation calculation for the first example, ninth comparative example, and 10th comparative example.
Figure 15B:
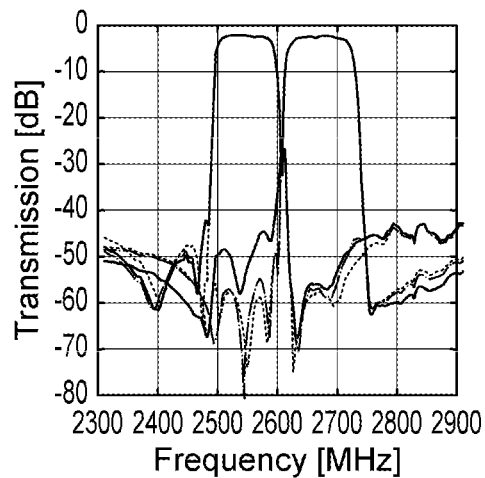
Figure 15C:
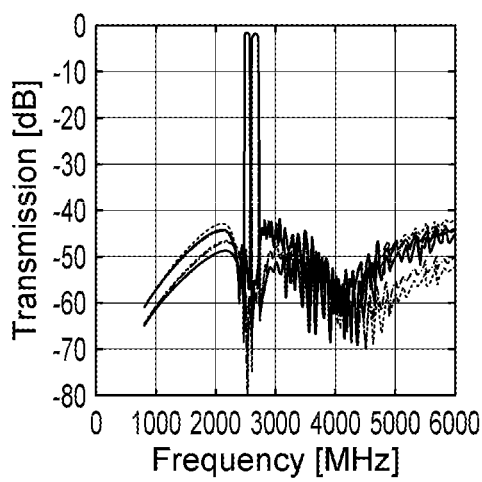
Figure 15D:
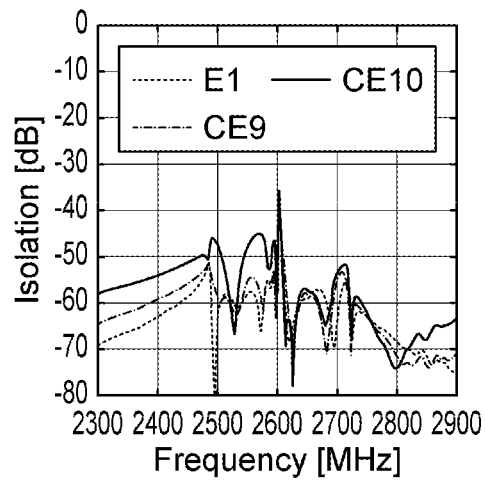
Figure 15E:
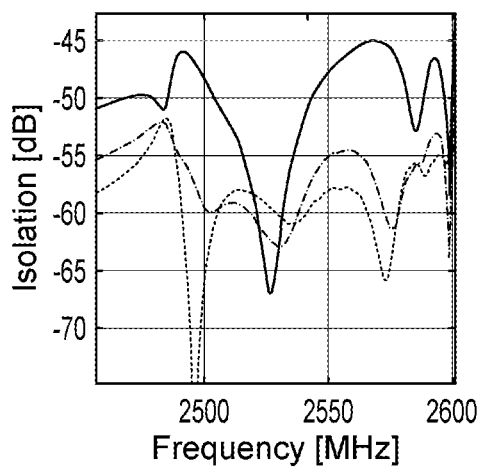

FIG. 14B is a view corresponding to FIG. 3B and shows the configuration of a multiplexer 391 in a 10th comparative example. A reinforcing layer 393 in this multiplexer 391 is obtained by connecting the reinforcing layer 383 in the ninth comparative example to the fifth GND terminal 9G5.

FIG. 15A to FIG. 15E are graphs corresponding to FIG. 5A to FIG. 5E and show the results of simulation calculation for the first example, ninth comparative example, and 10th comparative example. The notations assigned to the types of lines are as follows: E1: first example (FIG. 3B), CE9: ninth comparative example (FIG. 14A), and CE10: 10th comparative example (FIG. 14B).

In the ninth comparative example and 10th comparative example, the isolation is deteriorated in comparison with the first example. This is for example considered to occur due to movement of the pole since the inductance in the reference potential portion becomes larger by division of the reinforcing layer between the transmission filter 41 and the receiving filter 43. However, even in the ninth comparative example and 10th comparative example, the probability of coupling of the transmission filter 41 and the receiving filter 43 through the reinforcing layer is reduced. Therefore, for example, in comparison with an embodiment provided with the reinforcing layer facing the entireties of the transmission filter 41 and the receiving filter 43 and having no notch portions (59, 315, or the like) formed at all, an effect of improving the isolation can be expected.

<Communication Apparatus>

Figure 16:
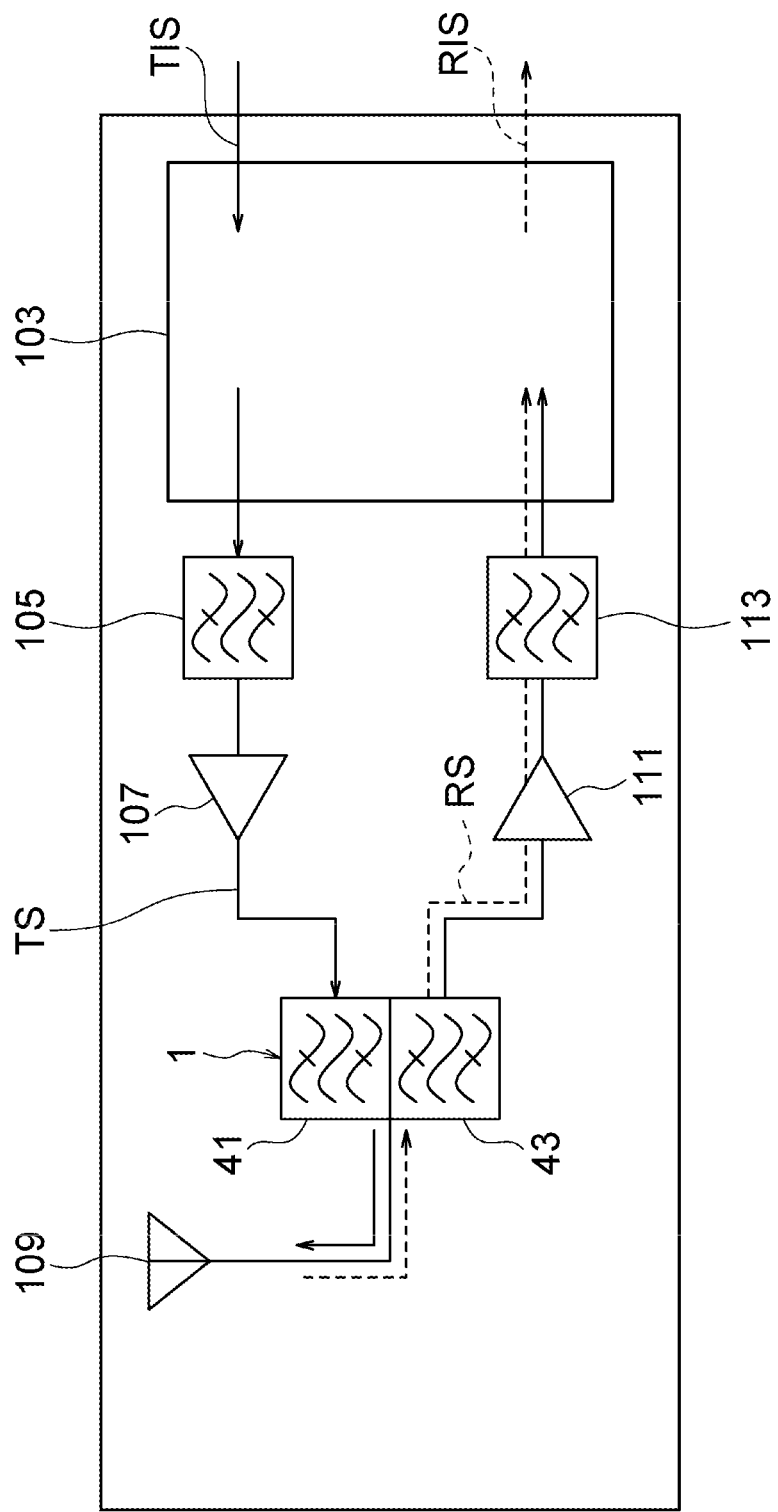
FIG. 16 is a schematic view showing a communication apparatus as an example of use of the multiplexer.

FIG. 16 is a block diagram showing principal parts of a communication apparatus 101 as an example of use of the multiplexer 1. The communication apparatus 101 performs wireless communication utilizing radio waves and includes the multiplexer 1.

In the communication apparatus 101, a transmission information signal TIS including the information to be transmitted is modulated and raised in frequency (conversion to a high frequency signal having a carrier frequency) by the RF-IC (radio frequency integrated circuit) 103 to form a transmission signal TS. The transmission signal TS is stripped of unwanted components out of the transmission-use passing band by a bandpass filter 105, amplified by an amplifier 107, and input to the multiplexer 1 (transmission terminal 9T). Further, the multiplexer 1 removes the unwanted components out of the transmission-use passing band from the input transmission signal TS and outputs the transmission signal TS after the removal from the antenna terminal 9A to an antenna 109. The antenna 109 converts the input electrical signal (transmission signal TS) to a wireless signal (radio wave) and transmits the result.

Further, in the communication apparatus 101, the wireless signal (radio wave) received by the antenna 109 is converted to an electrical signal (reception signal RS) by the antenna 109 and is input to the multiplexer 1 (antenna terminal 9A). The multiplexer 1 removes the unwanted components out of the reception-use passing band from the input reception signal RS and outputs the result from reception terminal 9R to an amplifier 111. The output reception signal RS is amplified by the amplifier 111 and is stripped of unwanted components out of the reception-use passing band by a bandpass filter 113. Further, the reception signal RS is lowered in frequency and demodulated by the RF-IC 103 to thereby form a reception information signal RIS.

Note that, the transmission information signal TIS and reception information signal RIS may be low frequency signals (baseband signals) including suitable information. For example, they are analog audio signals or digital audio signals. The passing band of the wireless signal may be one according to various standards such as the UMTS. The modulation system may be phase modulation, amplitude modulation, frequency modulation, or any combination of two or more among them. As the circuit system, a direct conversion system was illustrated in FIG. 16. However, a suitable system other than that may be employed. For example, it may be a double super heterodyne system as well. Further, FIG. 14 schematically shows only the principal part. A low pass filter or isolator etc. may be added to a suitable position as well. Further, the position of amplifier or the like may be changed as well.

Note that, in the above embodiments, the substrate 3 is an example of the piezoelectric substrate, the upper surface of the substrate 3 is an example of the first surface, the IDT electrode 23 is an example of the electrode, the antenna terminal 9A is an example of the common terminal, the transmission terminal 9T is an example of the first terminal, the reception terminal 9R is an example of the second terminal, the transmission filter 41 is an example of the first filter (or second filter), the receiving filter 43 is an example of the second filter (or first filter), each of the first GND terminal 9G1 to the fourth GND terminal 9G4 is an example of the first reference potential terminal, the fifth GND terminal 9G5 is an example of the second reference potential terminal, the second serial resonator 51B (or first serial resonator 51A) is an example of the first resonator (or second resonator), the third serial resonator 51C (or fourth serial resonator 51D) is an example of the second resonator (or first resonator), and the RF-IC 103 is an example of the integrated circuit element.

The present invention is not limited to the above embodiments, and may be executed in various ways.

The acoustic wave device is not limited to a SAW device. For example, it may one utilizing a bulk wave or may be one including a film bulk acoustic resonator. The acoustic wave device is not limited to a multiplexer having a transmission filter and receiving filter (duplexer in a narrow sense). For example, it may be a multiplexer for demultiplexing of a plurality of reception signals as well. Further, the acoustic wave device may be one performing demultiplexing of three or more signals or may be one having three or more filters.

The reinforcing layer is not limited to one of a solid pattern. For example, the reinforcing layer may be comb-shaped, may be lattice shaped, or may be mesh shaped. Note that, as understood also from the fact that the notch portion 59 may be provided in the first area part 57A, even if it can be conceived that a plurality of portions (for example a plurality of teeth of a comb) are provided in the reinforcing layer, so far as the plurality of portions are connected with each other, these plurality of portions configure one area part in the reinforcing layer in the present disclosure.

The multiplexer 1 (acoustic wave device) may have a sufficiently thin insulation layer in comparison with the thickness of the lid 15 covering the reinforcing layer 11 while making the terminals 9 exposed as well. Further, the multiplexer 1 may have a second lid which is superimposed on the lid 15 from the top of the reinforcing layer 11 and has a thickness equivalent to that of the lid 15 as well. In this aspect, the terminals 9 may pass through the second lid in addition to the cover 7 as well. In these aspects, if the cover is defined including the insulation layer or second lid, the reinforcing layer 11 is provided inside the cover. However, in the present disclosure, the portion on the lower side from the reinforcing layer 11 is referred to as the "cover".

The acoustic wave device may have a suitable configuration other than the configurations exemplified in the embodiments. For example, it may have an electrode which is superimposed on the lower surface of the piezoelectric substrate and is provided for discharging a charge charged in the lower surface and an insulating protective layer covering this electrode as well. Bumps may be formed on the upper surfaces of the terminals as well.

The filter in the acoustic wave device is not limited to a ladder type filter and may be another type of filter. For example, the filter may be a vertically coupled double mode type filter in which a plurality of IDT electrodes are arranged in the direction of propagation of the SAW as well.

Note that, the common terminal, first terminal, second terminal, and GND terminals etc. need not be ones passing through the cover either. For example, they may be ones which are led from the first surface of the piezoelectric substrate up to the upper surface of the cover along the outer side surfaces of the cover as well.

Further, the reinforcing layer and the resonator may be connected to the reference potential by different routes as well.

Note that, from the present disclosure, the following technical concept can be derived:

An acoustic wave including
a piezoelectric substrate including a first surface,
a plurality of electrodes which are located on the first surface and excite acoustic waves,
an insulating cover located on the first surface so as to configure one or more spaces above the plurality of electrodes,
a common terminal, first terminal, and second terminal which are all located on the first surface and pass through the cover, and
a reinforcing layer which is located on the cover and is made of metal, wherein
by the plurality of electrodes,
a first filter which is located in a first signal path connecting the common terminal and the first terminal and
a second filter which is located in a second signal path connecting the common terminal and the second terminal are configured, and
the reinforcing layer includes a notch portion which is located between the first filter and the second filter in a transparent projection view of the first surface.

REFERENCE SIGNS LIST

1 . . . multiplexer (acoustic wave device), 3 . . . substrate (piezoelectric substrate), 3a . . . upper surface (first surface), 7 . . . cover, 11 . . . reinforcing layer, 23 . . . IDT electrode (electrode), 9A . . . antenna terminal (common terminal), 9T . . . transmission terminal (first terminal (or second terminal)), 9R . . . reception terminal (second terminal (or first terminal)), 41 . . . transmission filter (first filter (or second filter)), 43 . . . receiving filter (second filter (or first filter)), 57A . . . first area part, and 57B . . . second area part.

The invention claimed is:

1. An acoustic wave device comprising:
a piezoelectric substrate comprising a first surface;
an insulating cover located on the first surface configuring one or more spaces above the plurality of electrodes;
a common terminal, first terminal, and second terminal which are all located on the first surface and pass through the cover;
a first filter comprising one or more first resonators located in a first signal path connecting the common terminal and the first terminal, wherein each of the one or more first resonators comprises a pair of electrodes;
a second filter comprising one or more second resonators located in a second signal path connecting the common terminal and the second terminal, wherein each of the one or more second resonators comprises a pair of electrodes; and
a reinforcing layer which is located on the cover, is made of metal, and is connected to a reference potential, wherein the reinforcing layer comprises
a first area part which faces the first filter and a first portion of the second filter, and
a second area part which faces a second portion of the second filter and is separated from the first area part.

2. The acoustic wave device according to claim 1, further comprising a first reference potential terminal which is located on the first surface and passes through the cover, wherein the first area part is connected to the first reference potential terminal, and the second area part is made an electrically floating state.

3. The acoustic wave device according to claim 1, further comprising a first reference potential terminal and second reference potential terminal which are located on the first surface and pass through the cover, wherein the first area part is connected to the first reference potential terminal, and the second area part is connected to the second reference potential terminal.

4. A communication apparatus comprising
an antenna,
the acoustic wave device according to claim 1 in which the common terminal is connected to the antenna, and
an integrated circuit element connected to a first terminal and to a second terminal.

5. An acoustic wave device comprising:
a piezoelectric substrate comprising a first surface;
a plurality of electrodes which are located on the first surface and excite acoustic waves;
an insulating cover located on the first surface configuring one or more spaces above the plurality of electrodes;
a common terminal, first terminal, and second terminal which are all located on the first surface and pass through the cover; and
a reinforcing layer which is located on the cover, is made of metal, and is connected to a reference potential, wherein
by the plurality of electrodes,
a first filter which is located in a first signal path connecting the common terminal and the first terminal and
a second filter which is located in a second signal path connecting the common terminal and the second terminal are configured,
the reinforcing layer comprises
a first area part which faces the first filter and the second filter, and
a second area part which faces the second filter and is separated from the first area part,
the second filter comprises a first resonator and second resonator,
the first area part faces the first resonator in addition to the first filter, and
the second area part faces the second resonator.

6. The acoustic wave device according to claim 5, wherein:
the first filter is a transmission filter which outputs a signal input to the first terminal to the common terminal, the second filter is a receiving filter which outputs the signal input to the common terminal to the second terminal, the first resonator and the second resonator are connected in series to each other between the common terminal and the second terminal so that the second resonator is located on the side closer to the second terminal than the first resonator, the first area part faces only a portion in the second filter which is located on the side closer to the common terminal than the second resonator in its signal path, and the second area part faces only a portion in the second filter which is located on the side closer to the second terminal than the first resonator in its signal path.

7. The acoustic wave device according to claim 5, wherein a passband of the second filter is higher than a passband of the first filter.

8. The acoustic wave device according to claim 5, wherein the first area part comprises a notch portion which is located between the first filter and the first resonator in a transparent projection view of the first surface.

\* \* \* \* \*